United States Patent
Nakano

(10) Patent No.: US 11,266,001 B2
(45) Date of Patent: Mar. 1, 2022

(54) TARGET SUPPLY DEVICE, EXTREME ULTRAVIOLET LIGHT GENERATION APPARATUS, AND ELECTRONIC DEVICE MANUFACTURING METHOD

(71) Applicant: Gigaphoton Inc., Tochigi (JP)

(72) Inventor: Masaki Nakano, Oyama (JP)

(73) Assignee: Gigaphoton Inc., Tochigi (JP)

( * ) Notice: Subject to any disclaimer, the term of this patent is extended or adjusted under 35 U.S.C. 154(b) by 5 days.

(21) Appl. No.: 17/011,289

(22) Filed: Sep. 3, 2020

(65) Prior Publication Data

US 2020/0404770 A1 Dec. 24, 2020

Related U.S. Application Data

(63) Continuation of application No. PCT/JP2018/017216, filed on Apr. 27, 2018.

(51) Int. Cl.
 *H05G 2/00* (2006.01)
 *G03F 7/20* (2006.01)

(52) U.S. Cl.
 CPC ......... *H05G 2/006* (2013.01); *G03F 7/70033* (2013.01); *H05G 2/008* (2013.01)

(58) Field of Classification Search
 CPC .................................................. G03F 7/70033
 See application file for complete search history.

(56) References Cited

U.S. PATENT DOCUMENTS

2017/0215266 A1    7/2017  Hirashita et al.

FOREIGN PATENT DOCUMENTS

| JP | 2008-221187 A | 9/2008 | |
| JP | 2011-204947 A | 10/2011 | |
| WO | 2016/072431 A1 | 5/2016 | |
| WO | WO-2016072431 A * | 5/2016 | ............. H05G 2/008 |

OTHER PUBLICATIONS

International Search Report issued in PCT/JP2018/017216; dated Jul. 31, 2018.
International Preliminary Report on Patentability and Written Opinion issued in PCT/JP2018/017216; dated Oct. 27, 2020.

* cited by examiner

*Primary Examiner* — Michelle M Iacoletti
(74) *Attorney, Agent, or Firm* — Studebaker & Brackett PC

(57) ABSTRACT

A target supply device according to an aspect of the present disclosure includes a nozzle through which a liquid target substance is output, and a vibration unit configured to vibrate the target substance supplied to the nozzle, and the vibration unit includes a vibration element configured to vibrate in accordance with applied drive voltage from outside, a vibration transfer unit contacting the nozzle and configured to transfer vibration of the vibration element to the nozzle, a load application member configured to apply a pressing load for pressing the vibration transfer unit against the nozzle, and a load adjustment device configured to adjust the pressing load in accordance with a signal from outside.

20 Claims, 27 Drawing Sheets

TARGET SUPPLY DEVICE, EXTREME ULTRAVIOLET LIGHT GENERATION APPARATUS, AND ELECTRONIC DEVICE MANUFACTURING METHOD

CROSS-REFERENCE TO RELATED APPLICATIONS

The present application is a continuation application of International Application No. PCT/JP2018/017216, filed on Apr. 27, 2018, the entire contents of which are hereby incorporated by reference.

BACKGROUND

1. Technical Field

The present disclosure relates to a target supply device, an extreme ultraviolet light generation apparatus, and an electronic device manufacturing method.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, for example, it is desired to develop an exposure apparatus including an extreme ultraviolet light generation apparatus configured to generate extreme ultraviolet (EUV) light at a wavelength of 13 nm approximately in combination with reduced projection reflective optical system.

Disclosed EUV light generation apparatuses include the three kinds of devices of a laser produced plasma (LPP) device that uses plasma generated by irradiating a target substance with a laser beam, a discharge produced plasma (DPP) device that uses plasma generated by electrical discharge, and a synchrotron radiation (SR) device that uses synchrotron radiation light.

LIST OF DOCUMENTS

Patent Documents

Patent Document 1: US Patent Application Publication No. 2017/0215266
Patent Document 2: Japanese Unexamined Patent Application Publication No. 2008-221187

SUMMARY

A target supply device according to an aspect of the present disclosure includes a nozzle through which a liquid target substance is output, and a vibration unit configured to vibrate the target substance supplied to the nozzle. The vibration unit includes a vibration element configured to vibrate in accordance with applied drive voltage, a vibration transfer unit contacting the nozzle and configured to transfer vibration of the vibration element to the nozzle, a load application member configured to apply a pressing load for pressing the vibration transfer unit against the nozzle, and a load adjustment device configured to adjust the pressing load in accordance with a signal from outside.

An extreme ultraviolet light generation apparatus according to another aspect of the present disclosure generates plasma from a target substance by irradiating the target substance with a laser beam to generate extreme ultraviolet light from the plasma, and includes a chamber into which the laser beam is introduced and a target supply device configured to supply the target substance into the chamber. The target supply device includes a nozzle through which a liquid target substance is output, and a vibration unit configured to vibrate the target substance supplied to the nozzle. The vibration unit includes a vibration element configured to vibrate in accordance with applied drive voltage, a vibration transfer unit contacting the nozzle and configured to transfer vibration of the vibration element to the nozzle, a load application member configured to apply a pressing load for pressing the vibration transfer unit against the nozzle, and a load adjustment device configured to adjust the pressing load in accordance with a signal from outside.

An electronic device manufacturing method according to another aspect of the present disclosure includes generating plasma from a target substance by irradiating the target substance with a laser beam to generate extreme ultraviolet light from the plasma by using an extreme ultraviolet light generation apparatus including a chamber into which the laser beam is introduced and a target supply device configured to supply the target substance into the chamber, the target supply device including a nozzle through which a liquid target substance is output and a vibration unit configured to vibrate the target substance supplied to the nozzle, the vibration unit including a vibration element configured to vibrate in accordance with applied drive voltage, a vibration transfer unit contacting the nozzle and configured to transfer vibration of the vibration element to the nozzle, a load application member configured to apply a pressing load for pressing the vibration transfer unit against the nozzle, and a load adjustment device configured to adjust the pressing load in accordance with a signal from outside; outputting the extreme ultraviolet light to an exposure apparatus; and exposing a photosensitive substrate to the extreme ultraviolet light in the exposure apparatus.

BRIEF DESCRIPTION OF THE DRAWINGS

Embodiments of the present disclosure will be described below as examples with reference to the accompanying drawings.

DESCRIPTION OF EMBODIMENTS

<Contents>
1. Overall description of extreme ultraviolet light generation system
   1.1 Configuration
   1.2 Operation
2. Terms
3. EUV light generation apparatus including target supply device
   3.1 Configuration
   3.2 Operation
4. Piezoelectric unit
   4.1 Configuration
   4.2 Operation
5. Target supply device
   5.1 Configuration
   5.2 Operation
   5.3. Exemplary vibration piezoelectric element duty adjustment
6. Problem
7. Embodiment 1
   7.1 Configuration
   7.2 Operation
   7.3 Effect
8. Embodiment 2
   8.1 Configuration
   8.2 Operation
   8.3 Effect
9. Embodiment 3
   9.1 Configuration
   9.2 Operation
   9.3 Exemplary vibration piezoelectric element duty adjustment
   9.4 Effect
10. Embodiment 4
   10.1 Configuration
   10.2 Operation
   10.3 Effect
11. Embodiment 5
   11.1 Configuration
   11.2 Operation
   11.3 Effect
12. Embodiment 6
   12.1 Configuration
   12.2 Operation
   12.3 Exemplary vibration piezoelectric element duty adjustment including pin load correction
   12.4 Effect
13. Embodiment 7
   13.1 Configuration
   13.2 Operation
   13.3 Effect
14. Embodiment 8
   14.1 Configuration
   14.2 Operation
   14.3 Effect
15. Embodiment 9
   15.1 Configuration
   15.2 Operation
   15.3 Effect
16. Combination of embodiments 17. Exemplary laser apparatus
18. Exemplary electronic device manufacturing method using EUV light generation apparatus Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

Figure 1:
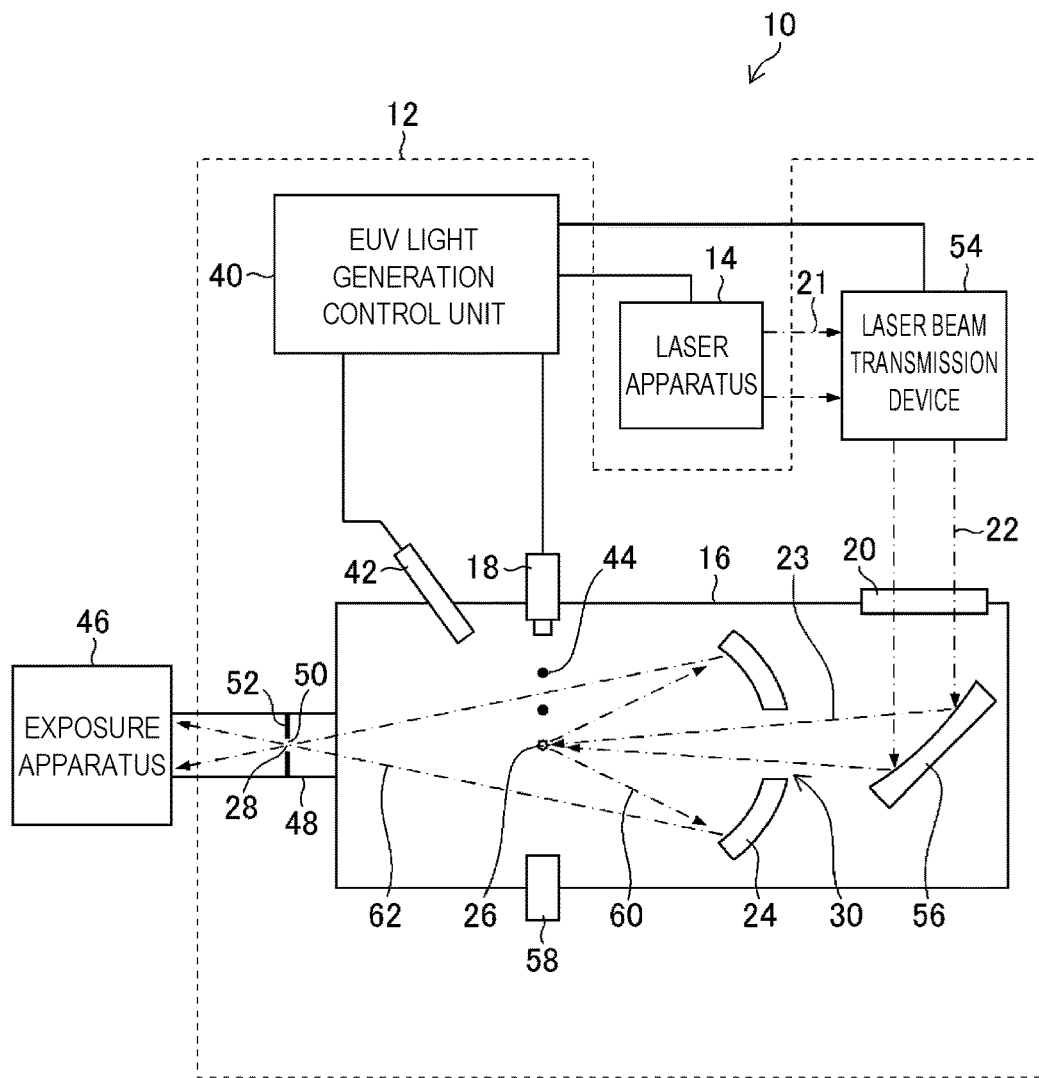
FIG. 1 is a diagram schematically illustrating the configuration of an exemplary LPP EUV light generation system.

1. Overall Description of Extreme Ultraviolet Light Generation System 1.1 Configuration FIG. 1 schematically illustrates the configuration of an exemplary LPP EUV light generation system 10. An EUV light generation apparatus 12 is used together with at least one laser apparatus 14. In the present application, a system including the EUV light generation apparatus 12 and the laser apparatus 14 is referred to as the EUV light generation system 10. The EUV light generation apparatus 12 includes a chamber 16 and a target supply unit 18.

The chamber 16 is a sealable container. The target supply unit 18 supplies a target substance into the chamber 16 and is attached to penetrate through the wall of the chamber 16, for example. The material of the target substance may contain tin, terbium, gadolinium, lithium, xenon, or a combination of two or more of these materials, but is not limited thereto.

At least one through-hole is provided to the wall of the chamber 16. The through-hole is blocked by a window 20 through which a pulse laser beam 22 output from the laser apparatus 14 transmits. For example, an EUV light condensing mirror 24 having a spheroidal reflective surface is disposed inside the chamber 16. The EUV light condensing mirror 24 has a first focal point and a second focal point. For example, a multi-layer reflective film obtained by alternately stacking molybdenum and silicon is formed on the surface of the EUV light condensing mirror 24. The EUV light condensing mirror 24 is disposed such that, for example, the first focal point is positioned in a plasma generating region 26 and the second focal point is positioned at an intermediate focusing point (IF) 28. A through-hole 30 is provided at a central part of the EUV light condensing mirror 24 so that a pulse laser beam 23 passes through the through-hole 30.

The EUV light generation apparatus 12 includes an EUV light generation control unit 40, a target sensor 42, and the like. The target sensor 42 detects one or a plurality of the existence, locus, position, and speed of a target 44. The target sensor 42 may have an image capturing function.

The EUV light generation apparatus 12 also includes a connection unit 48 that provides communication between the inside of the chamber 16 and the inside of an exposure apparatus 46. The connection unit 48 includes a wall 52 through which an aperture 50 is formed. The wall 52 is disposed such that the aperture 50 is positioned at the second focal point of the EUV light condensing mirror 24.

In addition, the EUV light generation apparatus 12 includes a laser beam transmission device 54, a laser beam condensing mirror 56, a target collector 58 for collecting the target 44, and the like. The laser beam transmission device 54 includes an optical element for defining the transmission state of a laser beam, and an actuator for adjusting the position, posture, and the like of the optical element. The target collector 58 is disposed on the extended line of a direction in which the target 44 output into the chamber 16 travels.

The laser apparatus 14 may be a master oscillator power amplifier (MOPA) system. The laser apparatus 14 may include a master oscillator (not illustrated), an optical isolator (not illustrated), and a plurality of $CO_2$ laser amplifiers (not illustrated). The wavelength of a laser beam output from the master oscillator is, for example, 10.59 μm, and the repetition frequency of pulse oscillation is, for example, 100 kHz.

1.2 Operation

The following describes the operation of the exemplary LPP EUV light generation system 10 with reference to FIG. 1. The inside of the chamber 16 is held at a pressure lower than atmospheric pressure and may be preferably vacuum. Alternatively, gas having a high EUV light transmissivity exists inside the chamber 16. The gas existing inside the chamber 16 may be, for example, hydrogen gas.

A pulse laser beam 21 output from the laser apparatus 14 passes through the laser beam transmission device 54 and is incident in the chamber 16 through the window 20 as the pulse laser beam 22. The pulse laser beam 22 travels along at least one laser beam path in the chamber 16 and is reflected by the laser beam condensing mirror 56 and incident on at least one target 44 as the pulse laser beam 23.

The target supply unit 18 outputs the target 44 made of the target substance toward the plasma generating region 26 in the chamber 16. The target supply unit 18 forms droplets by, for example, a continuous jet scheme. In the continuous jet scheme, a nozzle is vibrated to provide periodic vibration to flow of the target substance ejected in a jet form from a nozzle hole, thereby periodically separating the target substance. The separated target substance may form a free interface by the own surface tension, thereby forming a droplet.

The target 44 is irradiated with at least one pulse included in the pulse laser beam 23. Plasma is generated from the target 44 irradiated with the pulse laser beam 23, and radiates radiation light 60. EUV light 62 contained in the radiation light 60 is selectively reflected by the EUV light condensing mirror 24. The EUV light 62 reflected by the EUV light condensing mirror 24 is condensed at the intermediate focusing point 28 and is output to the exposure apparatus 46. One target 44 may be irradiated with a plurality of pulses included in the pulse laser beam 23.

The EUV light generation control unit 40 collectively controls the entire EUV light generation system 10. The EUV light generation control unit 40 processes a result of detection by the target sensor 42. The EUV light generation control unit 40 controls, based on the result of detection by the target sensor 42, the output timing of the target 44, the output direction of the target 44, and the like. In addition, the EUV light generation control unit 40 controls the oscillation timing of the laser apparatus 14, the traveling direction of the pulse laser beam 22, the focusing position of the pulse laser beam 23, and the like. Various kinds of control described above are merely exemplary and may include other control as necessary.

2. Terms

"Target" is an object irradiated with a laser beam introduced into the chamber. When irradiated with the laser beam, the target generates plasma and radiates EUV light. The target is the plasma generation source.

"Droplet" is a form of a target supplied into the chamber. The droplet may be the target having a substantially spherical shape by the surface tension of the target substance being melted. "Droplet trajectory" is a path on which a droplet travels inside the chamber.

"Pulse laser beam" may be a laser beam including a plurality of pulses. "Laser beam" is not limited to a pulse laser beam but may be a general laser beam. "Laser beam path" is the optical path of a laser beam.

"Plasma light" is radiation light radiated from the target as plasma. This radiation light includes EUV light.

"EUV light" stands for "extreme ultraviolet light". "Extreme ultraviolet light generation apparatus" is referred to as "EUV light generation apparatus".

"Piezoelectric element" is synonymous with a dielectric element. The piezoelectric element is simply referred to as "piezoelectric" in some cases. A piezoelectric element used as a vibration element configured to generate droplets by vibrating the target substance in a liquid form is referred to as a "vibration piezoelectric element" in some cases.

"Duty" is the ratio of a high-voltage level side voltage time (Th) relative to one pulse period (T) in an electric signal of rectangular wave. In the present specification, the "duty" is the duty of a drive voltage waveform applied to the vibration piezoelectric element. The duty is expressed in percentage [%] in the present specification. The numerical value of the duty is referred to as a duty value.

Figure 2:
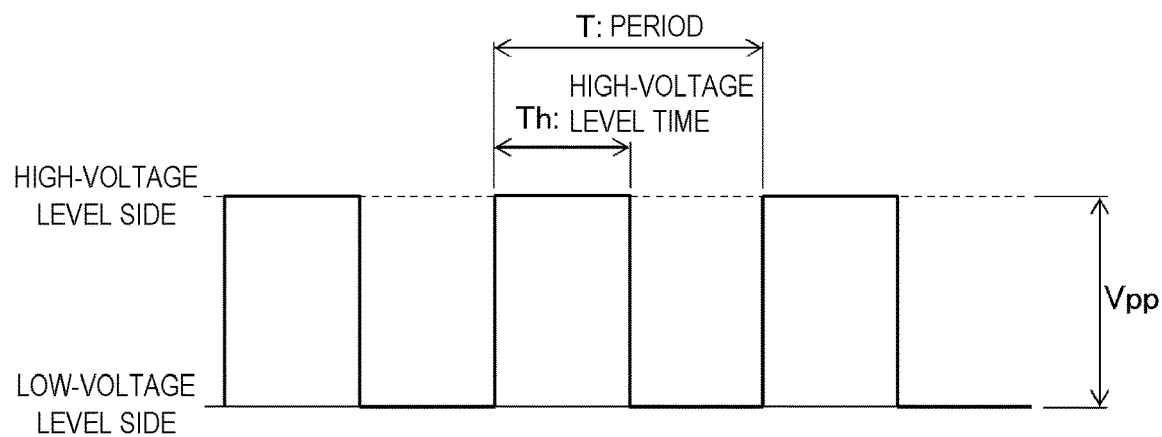
FIG. 2 is a waveform diagram illustrating an exemplary voltage waveform of rectangular wave.

FIG. 2 illustrates an exemplary voltage waveform of rectangular wave. The horizontal axis represents time, and the vertical axis represents voltage. The duty [%] is (Th/T)*100. In FIG. 2, "Vpp" is the voltage difference between a high-voltage level side voltage and a low-voltage level side voltage. Vpp is referred to as an application voltage.

Figure 3:
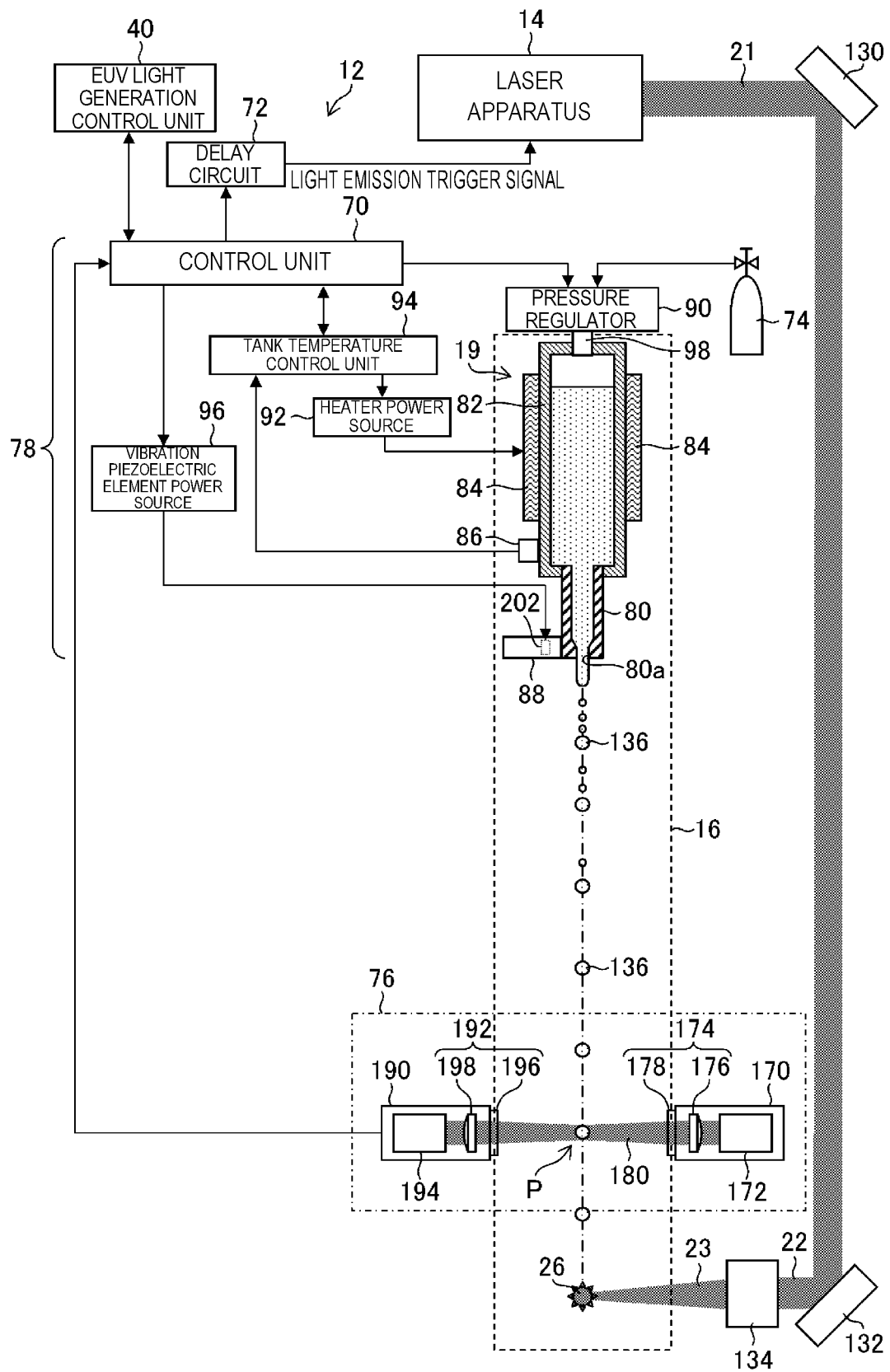
FIG. 3 is a diagram schematically illustrating the configuration of an EUV light generation apparatus including a target supply device.

3. EUV Light Generation Apparatus Including Target Supply Device 3.1 Configuration FIG. 3 schematically illustrates the configuration of an EUV light generation apparatus including a target supply device. The EUV light generation apparatus 12 includes a droplet generator 19, a control unit 70, a delay circuit 72, an inert gas supply unit 74, and a droplet detection device 76.

The droplet generator 19 includes a nozzle 80 from which the target substance is output, a tank 82 in which the target substance is stored, a heater 84, a tank temperature sensor 86, a piezoelectric unit 88, and a pressure regulator 90. The droplet generator 19 is an exemplary target supply unit 18.

A target supply device 78 includes the droplet generator 19, the control unit 70, a heater power source 92, a tank temperature control unit 94, and a vibration piezoelectric element power source 96. The droplet detection device 76 may be included in the configuration of the target supply device 78.

The tank 82 is formed in a hollow tubular shape. The target substance is housed inside the hollow tank 82. At least the inside of the tank 82 is formed of a material that is unlikely to react with the target substance. When tin is used as an exemplary target substance, for example, any of SiC, $SiO_2$, $Al_2O_3$, molybdenum, tungsten, and tantalum may be used as a material that is unlikely to react with tin.

The heater 84 and the tank temperature sensor 86 are fixed to the tank 82. The heater 84 is fixed to an outer side surface part of the tank 82. The heater 84 fixed to the tank 82 heats the tank 82. The heater 84 is connected with the heater power source 92.

The heater power source 92 supplies electrical power to the heater 84. The heater power source 92 is connected with the tank temperature control unit 94. The tank temperature control unit 94 may be connected with the control unit 70 or included in the control unit 70. The electrical power supply from the heater power source 92 to the heater 84 is controlled by the tank temperature control unit 94.

The tank temperature sensor 86 is fixed to the outer side surface part of the tank 82. The tank temperature sensor 86 is connected with the tank temperature control unit 94. The tank temperature sensor 86 detects the temperature of the tank 82 and outputs tank temperature information to the tank temperature control unit 94. The tank temperature control unit 94 can adjust the electrical power supplied to the heater 84 based on the tank temperature information output from the tank temperature sensor 86. The tank temperature control unit 94 outputs a heater power source control signal to the heater power source 92.

A tank temperature adjustment mechanism including the heater 84 and the heater power source 92 can adjust the temperature of the tank 82 based on the heater power source control signal from the tank temperature control unit 94.

The pressure regulator 90 is disposed on a pipe 98 between the inert gas supply unit 74 and the tank 82. The pipe 98 can provide communication between the droplet generator 19 including the tank 82 and the pressure regulator 90. The pipe 98 may be covered by a heat insulation material (not illustrated) or the like. A heater (not illustrated) is disposed on the pipe 98. The temperature in the pipe 98 may be maintained equal to the temperature in the tank 82 of the droplet generator 19.

The inert gas supply unit 74 includes a gas tank filled with inert gas such as helium or argon. The inert gas supply unit 74 supplies the inert gas into the tank 82 through the pressure regulator 90. In the present example, the inert gas is argon.

The pressure regulator 90 may include an electromagnetic valve, a pressure sensor, and the like (not illustrated) for gas supply and discharge. The pressure regulator 90 detects the pressure in the tank 82 by using the pressure sensor (not illustrated). The pressure regulator 90 is coupled with a gas discharge pump (not illustrated). The pressure regulator 90 operates the gas discharge pump (not illustrated) to discharge gas from the tank 82.

The pressure regulator 90 can increase or decrease the pressure in the tank 82 by supplying gas into the tank 82 or discharging gas from the tank 82. The pressure regulator 90 is connected with the control unit 70. The pressure regulator 90 outputs a detection signal of a detected pressure to the control unit 70. The pressure regulator 90 receives a control signal output from the control unit 70.

The control unit 70 supplies, based on the detection signal output from the pressure regulator 90, the pressure regulator 90 with a pressure command signal for controlling the operation of the pressure regulator 90 so that the pressure in the tank 82 becomes equal to a target pressure. The pressure regulator 90 supplies gas into the tank 82 or discharges gas from the tank 82 based on the pressure command signal from the control unit 70. The pressure in the tank 82 can be adjusted to the target pressure through the gas supply or discharge by the pressure regulator 90.

The nozzle 80 includes a nozzle hole 80a through which the target substance is output. The target substance output through the nozzle hole 80a may be, for example, liquid tin.

The nozzle 80 is provided at a bottom surface part of the tubular tank 82. The nozzle 80 is disposed inside the chamber 16 through a target supply hole (not illustrated) of the chamber 16. The target supply hole of the chamber 16 is blocked when the droplet generator 19 is disposed. When the droplet generator 19 is disposed to block the target supply hole of the chamber 16, the inside of the chamber 16 is isolated from atmosphere.

One end of the nozzle 80 is fixed to the hollow tank 82. The other end of the nozzle 80 is provided with the nozzle hole 80a. The nozzle hole 80a is positioned inside the chamber 16. The tank 82 and the nozzle 80 may be both positioned inside the chamber 16. Instead of this example, part or all of the tank 82 on the one end side of the nozzle 80 may be positioned outside the chamber 16, and the nozzle hole 80a on the other end side of the nozzle 80 may be positioned inside the chamber 16.

The plasma generating region 26 inside the chamber 16 is positioned on the extended line of the center axis of the nozzle hole 80a. The insides of the tank 82, the nozzle 80, and the chamber 16 are communicated with each other. At least the inner surface of the nozzle 80 is formed of a material that is unlikely to react with the target substance.

The nozzle hole 80a is formed in such a shape that the target substance being melted is ejected in a jet form into the chamber 16.

The piezoelectric unit 88 is fixed to the nozzle 80. The piezoelectric unit 88 includes a piezoelectric element 202 for vibration. The piezoelectric element 202 may be a single-layer piezoelectric element. Alternatively, the piezoelectric element 202 may be a stacked-layer piezoelectric element. The piezoelectric element 202 is connected with the vibration piezoelectric element power source 96.

Tin droplets are continuously output from the nozzle 80 when a vibration piezoelectric element drive signal of rectangular wave at a predetermined frequency is applied from the vibration piezoelectric element power source 96 to the piezoelectric element 202. While falling, a plurality of droplets output from the nozzle 80 can connect with each other and coalesce into a droplet 136 having a necessary mass.

The piezoelectric unit 88 and the vibration piezoelectric element power source 96 may be components of a droplet formation mechanism that provides vibration necessary for formation of the droplet 136 to the nozzle 80.

The vibration piezoelectric element power source 96 supplies electrical power to the piezoelectric element 202. The vibration piezoelectric element power source 96 is connected with the control unit 70. The control unit 70 controls the electrical power supply to the piezoelectric element 202 through the vibration piezoelectric element power source 96.

The droplet detection device 76 may be part or the entire of the target sensor 42 described with reference to FIG. 1. The droplet detection device 76 detects the droplet 136 output into the chamber 16.

The droplet detection device 76 includes a light source unit 170 and a light receiving unit 190. The light source unit 170 includes a light source 172 and an illumination optical system 174. The light source unit 170 is disposed to illuminate a droplet at a predetermined position P on the droplet trajectory between the nozzle 80 of the target supply unit 18 and the plasma generating region 26. The light source 172 may be a continuous-wave (CW) laser beam source. The illumination optical system 174 includes a light condensing lens 176 and a window 178. The window 178 is disposed at the wall of the chamber 16.

The beam diameter of a continuous laser beam with which the droplet 136 is irradiated may be sufficiently larger than the diameter of the droplet 136. The diameter of the droplet 136 is, for example, 20 μm.

The light source unit 170 and the light receiving unit 190 are disposed opposite to each other with the traveling path of the droplet 136 output into the chamber 16 interposed therebetween. The direction in which the light source unit 170 and the light receiving unit 190 are opposite to each other may be orthogonal to the traveling path of the droplet 136.

When the droplet 136 traveling on the droplet trajectory reaches the predetermined position P, the droplet 136 can be irradiated with illumination light 180 emitted from the light source unit 170.

The light receiving unit 190 includes a light receiving optical system 192 and a photosensor 194. The light receiving unit 190 is disposed to receive the illumination light 180 output from the light source unit 170. The light receiving optical system 192 includes a window 196 and a light condensing lens 198. The light receiving optical system 192 may be an optical system such as a collimator and includes an optical element such as a lens. The window 196 is disposed at the wall of the chamber 16. The light receiving optical system 192 guides, to the photosensor 194, a continuous laser beam emitted from the light source unit 170.

The photosensor 194 is a light receiving element including one or a plurality of light receiving surfaces. The photosensor 194 may be any of a photodiode, a photodiode array, an avalanche photodiode, a photomultiplier, a multi pixel photon counter, and an image intensifier. The photosensor 194 detects the light intensity of the continuous laser beam guided by the light receiving optical system 192 and supplies a detection signal of the detected light intensity to the control unit 70.

As the droplet 136 passes through the predetermined position P on the droplet trajectory, part of the continuous laser beam is shielded by the droplet 136, and the light intensity received by the light receiving unit 190 decreases. The light receiving unit 190 can output, to the control unit 70, a detection signal in accordance with the light intensity decrease due to the passing of the droplet 136.

The control unit 70 may generate, from the detection signal, a passage timing signal indicating a passage timing of the droplet. The "passage timing" is the timing at which the droplet 136 passes through the predetermined position P on the target trajectory. For example, the control unit 70 may generate the passage timing signal that is at high level in a duration in which the light amount received by the photosensor 194 is equal to or lower than a predetermined threshold. Alternatively, the passage timing signal may be generated at the droplet detection device 76. In other words, the droplet detection device 76 may output the passage timing signal synchronized with the passage timing of the droplet 136 and may input the passage timing signal to the control unit 70. The droplet detection device 76 is an exemplary droplet detection unit.

The control unit 70 can detect, based on the passage timing signal from the droplet detection device 76, the timing at which the droplet 136 has passed through the predetermined position P on the droplet trajectory.

The passage timing signal is input to the delay circuit 72 through the control unit 70. The delay circuit 72 is connected with a signal line through which a delay time is set to the delay circuit 72 by the control unit 70. An output from the delay circuit 72 is input to the laser apparatus 14 as a light emission trigger signal.

The EUV light generation apparatus 12 includes a first high reflectance mirror 130, a second high reflectance mirror 132, and a laser beam condensation optical system 134. The laser beam transmission device 54 described with reference to FIG. 1 includes the first high reflectance mirror 130 and the second high reflectance mirror 132. The laser beam condensation optical system 134 includes the laser beam condensing mirror 56 described with reference to FIG. 1.

The chamber 16 of the EUV light generation apparatus 12 is formed in, for example, a hollow spherical shape or a tubular shape. The direction of the center axis of the tubular chamber 16 may be the direction in which the EUV light 62 is guided to the exposure apparatus 46. The chamber 16 includes an exhaust device and a pressure sensor (both not illustrated).

The EUV light generation control unit 40 communicates signals with an exposure apparatus control unit (not illustrated) as a control unit of the exposure apparatus 46. The EUV light generation control unit 40 collectively controls the operation of the entire EUV light generation system 10 based on a command from the exposure apparatus 46. The EUV light generation control unit 40 communicates control signals with the laser apparatus 14. Accordingly, the EUV light generation control unit 40 controls the operation of the laser apparatus 14.

The EUV light generation control unit 40 communicates control signals with an actuator (not illustrated) of each of the laser beam transmission device 54 and the laser beam condensation optical system 134. Accordingly, the EUV light generation control unit 40 adjusts the traveling direction and the focusing position of each of the pulse laser beams 21, 22, and 23.

The EUV light generation control unit 40 communicates control signals between the target supply device 78 and the control unit 70. Accordingly, the EUV light generation control unit 40 controls the operation of the target supply device 78 and the laser apparatus 14.

In the present disclosure, the EUV light generation control unit 40, the control unit 70, the tank temperature control unit 94, and any other control devices and processing units can be achieved by hardware and software combination of one or a plurality of computers. Each computer may include a central processing unit (CPU) and a memory. The software is synonymous with a computer program. The computers conceptually include a programmable controller.

Some or all of processing functions of the EUV light generation control unit 40, the control unit 70, the tank temperature control unit 94, and any other control device may be achieved by using an integrated circuit such as a field programmable gate array (FPGA) or an application specific integrated circuit (ASIC).

Functions of a plurality of control devices can be achieved by a single control device. In the present disclosure, these control devices may be connected with each other through a communication network such as a local area network or the Internet. In a distributed computing environment, a program unit may be stored in both of local and remote memory storage devices.

3.2 Operation

The following describes the operation of the EUV light generation apparatus 12 with reference to FIG. 3. The EUV light generation control unit 40 controls the exhaust device (not illustrated) such that the chamber 16 is vacuum. The EUV light generation control unit 40 controls, based on a detected value of the pressure sensor (not illustrated), gas discharge by the exhaust device and gas supply from a gas supply device (not illustrated) such that the pressure in the chamber 16 is in a predetermined range.

When having received a target generation signal from the EUV light generation control unit 40, the control unit 70 controls the heater 84 through the tank temperature control unit 94 such that the target substance in the droplet generator 19 has a predetermined temperature equal to or higher than the melting point. The tank temperature control unit 94 controls the heater power source 92 based on a detected value of the tank temperature sensor 86 under control of the control unit 70. The tank temperature control unit 94 transmits the heater power source control signal to the heater power source 92. The heater power source 92 supplies heater electrical power to the heater 84 in accordance with the heater power source control signal.

When tin (Sn), which has a melting point of 232° C., is used as the target substance, the control unit 70 controls the heater 84 such that tin in the droplet generator 19 has, for example, a predetermined temperature in the range of 232° C. to 300° C. As a result, the tin stored in the tank 82 melts into liquid. The melted tin can correspond to a form of "liquid target substance".

To discharge the liquid target substance through the nozzle hole 80a, the control unit 70 controls the pressure regulator 90 such that the pressure in the tank 82 becomes equal to a predetermined pressure. The pressure regulator 90 can increase or decrease the pressure in the tank 82 by supplying gas into the tank 82 or discharging gas from the tank 82 based on a control signal from the control unit 70. Specifically, the pressure regulator 90 adjusts, in accordance with an instruction from the control unit 70, the pressure in the tank 82 to a predetermined value such that the droplet 136 reaches the plasma generating region 26 through a predetermined target trajectory at a predetermined target speed.

The predetermined target speed of the droplet 136 may be in, for example, the range of 60 m/s to 120 m/s. The predetermined value of the pressure of the tank 82 may be in, for example, the range of several MPa to 40 MPa. As a result, a jet of the liquid target substance is ejected at the predetermined speed through the nozzle hole 80a.

The control unit 70 transmits, to the piezoelectric element 202, an electric signal from the vibration piezoelectric element power source 96 and performs duty adjustment to regularly generate the droplet 136 at a predetermined piezoelectric drive frequency from the liquid tin output through the nozzle 80. The contents of the duty adjustment will be described in detail later. An appropriate duty value suitable for generation of the droplet 136 is set through the duty adjustment.

The control unit 70 transmits an electric signal having a predetermined piezoelectric drive frequency and a predetermined duty to the piezoelectric element 202 through the vibration piezoelectric element power source 96 so that the droplet 136 is generated from the liquid tin output through the nozzle 80. Specifically, the control unit 70 transmits a voltage waveform signal for piezoelectric drive to the vibration piezoelectric element power source 96.

The vibration piezoelectric element power source 96 supplies piezoelectric drive voltage to the piezoelectric element 202 in accordance with an instruction from the control unit 70. The piezoelectric element 202 vibrates through the application of vibration piezoelectric element drive voltage to the piezoelectric element 202. The vibration of the piezoelectric element 202 propagates to the nozzle 80 and vibrates the liquid target substance through the nozzle 80. A jet of liquid tin output through the nozzle hole 80a separates into liquid drops while traveling. In this case, as the liquid target substance is provided with regular vibration that promotes droplet coalescence, the liquid drops coalesce so that the droplets 136 having volumes substantially equal to each other are periodically generated. Then, the droplets 136 can be supplied to the plasma generating region 26.

As each droplet 136 passes through the predetermined position P on the droplet trajectory between the nozzle hole 80a and the plasma generating region 26, the droplet detection device 76 generates a detection signal. The detection signal output from the droplet detection device 76 is transmitted to the control unit 70. The control unit 70 generates a passage timing signal indicating the passage timing of the droplet. The passage timing signal is input from the control unit 70 to the delay circuit 72.

The delay circuit 72 generates a light emission trigger signal by adding a delay time to the passage timing signal and inputs the light emission trigger signal to the laser apparatus 14. The delay time of the delay circuit 72 is set such that the light emission trigger signal is input to the laser apparatus 14 before the droplet 136 having passed through the predetermined position P reaches the plasma generating region 26. In other words, the delay time is set such that the droplet 136 is irradiated with a pulse laser beam output from the laser apparatus 14 when the droplet 136 reaches the plasma generating region 26.

The pulse laser beam output from the laser apparatus 14 is guided to the plasma generating region 26 through the first high reflectance mirror 130, the second high reflectance mirror 132, and the laser beam condensation optical system 134, and the droplet 136 is irradiated with the guided pulse laser beam. The plasma generating region 26 may correspond to the focusing position of the pulse laser beam.

4. Piezoelectric Unit 4.1 Configuration

Figure 4:
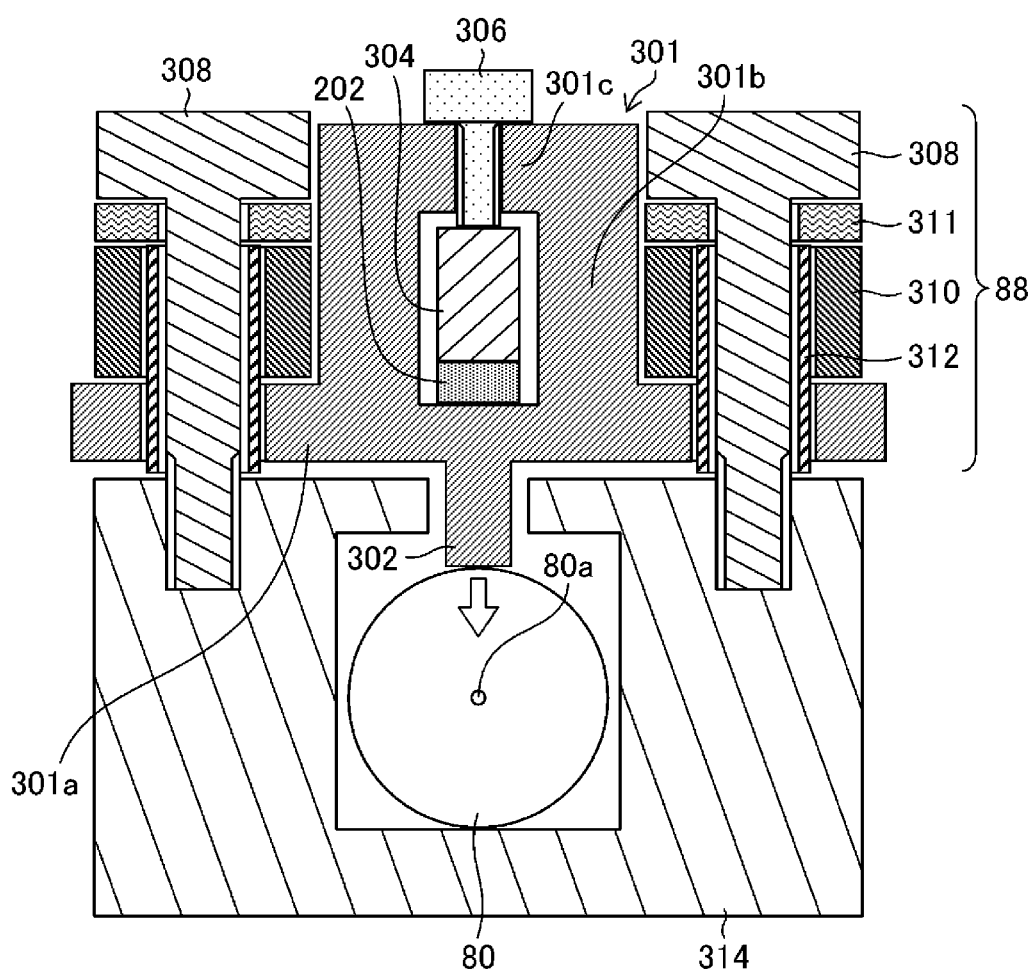
FIG. 4 is a cross-sectional view schematically illustrating an exemplary configuration of a piezoelectric unit and a nozzle.

FIG. 4 is a cross-sectional view schematically illustrating an exemplary configuration of the piezoelectric unit and the nozzle. FIG. 4 illustrates a section orthogonal to the center axis of the nozzle. The piezoelectric unit 88 includes a vibration transfer component 301, the piezoelectric element 202 for vibration, a vibration piezoelectric element fixing member 304, a vibration piezoelectric element holding bolt 306, a pin load bolt 308, a pin load spring 310, a first heat insulation component 311, and a second heat insulation component 312. A supporting component 314 that supports the piezoelectric unit 88 is disposed around the nozzle 80. The supporting component 314 has a screw hole into which a screw part of the pin load bolt 308 is screwed.

A pin 302 extending toward the center axis of the nozzle 80 is provided at a central part of the vibration transfer component 301. The pin 302 has a leading end in contact with a side surface of the nozzle 80. The vibration transfer component 301 includes a plate part 301a including the pin 302, two column parts 301b, and a beam part 301c. The vibration transfer component 301 may be formed as a single component or may be integrally formed by coupling a plurality of components.

In FIG. 4, the lower surface of the plate part 301a, in other words, a surface on which the pin 302 of the plate part 301a is provided is referred to as a "first surface of the plate part 301a". In FIG. 4, the upper surface of the plate part 301a, in other words, a surface on a side opposite to the first surface of the plate part 301a is referred to as a "second surface of the plate part 301a".

The piezoelectric element 202 is disposed on the second surface of the plate part 301a. The two column parts 301b are erected on both sides of the piezoelectric element 202, surrounding the piezoelectric element 202 on the second surface of the plate part 301a. The beam part 301c is provided across the two column parts 301b.

The beam part 301c is provided with a screw hole for screwing the vibration piezoelectric element holding bolt 306. The vibration piezoelectric element holding bolt 306 is screwed into the screw hole of the beam part 301c.

The vibration piezoelectric element fixing member 304 is disposed at the leading end of a shaft part of the vibration piezoelectric element holding bolt 306. The vibration piezoelectric element holding bolt 306 fixes the piezoelectric element 202 between the vibration transfer component 301 and the vibration piezoelectric element fixing member 304 by pressing the vibration piezoelectric element fixing member 304 against a surface of the piezoelectric element 202.

A through-hole into which the pin load bolt 308 is inserted to be fitted with is provided at the plate part 301a of the vibration transfer component 301.

The piezoelectric unit 88 includes the two pin load bolts 308. The two pin load bolts 308 are disposed at positions symmetrically centered at the pin 302. Each pin load bolt 308 is screwed into the screw hole of the supporting component 314 through the through-hole of the plate part 301a. The pin load spring 310 is disposed between a head part of the pin load bolt 308 and the plate part 301a. The pin load spring 310 receives a compression load when used. The pin load spring 310 may be, for example, a plate spring.

The first heat insulation component 311 is disposed between the head part of each pin load bolt 308 and the pin load spring 310. The second heat insulation component 312 is disposed between a shaft part of the pin load bolt 308 and the pin load spring 310. The pin load spring 310 and the first heat insulation component 311 may be annular components into which the shaft part of the pin load bolt 308 is inserted. A cooling water path (not illustrated) is provided to the vibration transfer component 301. The cooling water path is connected with a chiller unit (not illustrated) through a flow path (not illustrated)

4.2 Operation

In the configuration illustrated in FIG. 4, force that presses the vibration piezoelectric element fixing member 304 toward the piezoelectric element 202 is applied when the vibration piezoelectric element holding bolt 306 is screwed into the beam part 301c of the vibration transfer component 301. The piezoelectric element 202 is fixed to a central part of the plate part 301a while being sandwiched between the vibration piezoelectric element fixing member 304 and the plate part 301a.

In addition, a pressing load that presses the pin 302 of the vibration transfer component 301 against the nozzle 80 is applied to the vibration transfer component 301 through the pin load spring 310 when each of the two pin load bolts 308 is screwed into the screw hole of the supporting component 314. The force that presses the pin 302 against the nozzle 80 is referred to as a "pin load". In FIG. 4, a white arrow from the pin 302 toward the nozzle 80 expresses the pin load.

The magnitude of the pin load can be adjusted by adjusting the elastic force of each pin load spring 310 and the screwing torque or the screwing amount of each pin load bolt 308. When a plate spring is used as the pin load spring 310, the elastic force and the stroke are adjusted by adjusting the number of used plate springs, the direction in which the plate springs are placed over, the hardness of the plate springs, and the like. A load (preload) applied to the pin load spring 310 in advance is adjusted by adjusting the screwing torque or the screwing amount of the pin load bolt 308. The preload and the stroke may be adjusted by adjusting the thickness of a shim (not illustrated) and the number thereof.

Such work of adjusting the pin load is performed in a droplet generator assembly work process before the droplet generator 19 is assembled to the chamber 16. In adjustment of the pin load, the pin load spring 310 is adjusted and the screwing torque or the screwing amount of each of the pin load bolts 308 and the vibration piezoelectric element holding bolt 306 is adjusted such that vibration generated in the piezoelectric element 202 propagates to the target substance in the nozzle 80 through the pin 302. The pin load adjustment work is performed in an environment at room temperature. The room temperature in the assembly work environment may be, for example, 20° C. to 25° C.

The piezoelectric element 202 generates vibration when it expands and contracts based on voltage applied by the vibration piezoelectric element power source 96 and having a predetermined frequency. The generated vibration propagates to the target substance in the nozzle 80 through a vibration propagation path including the plate part 301a of the vibration transfer component 301, the pin 302, the nozzle 80, and the like.

5. Target Supply Device

5.1 Configuration

As described with reference to FIG. 3, the target supply device 78 includes the nozzle 80 through which liquid tin is discharged, the piezoelectric unit 88, the droplet detection device 76, and the control unit 70. The piezoelectric unit 88 is a vibration unit configured to provide, to the nozzle 80, vibration for promoting flying liquid tin droplets to coalesce. As illustrated in FIG. 4, the piezoelectric unit 88 includes the piezoelectric element 202 for generating vibration, the pin 302 for transferring the vibration of the piezoelectric element 202 to the nozzle 80, and the pin load spring 310 for generating force that presses the pin 302 against the nozzle 80.

The droplet detection device 76 detects a droplet passing through the predetermined position P and outputs a droplet detection signal indicating the passage timing. The passage timing interval between droplets can be measured based on the passage timing interval between droplet detection signals.

The control unit 70 can determine the quality of droplet coalescence based on the droplet detection signals obtained from the droplet detection device 76. The control unit 70 can control the duty value of a rectangular-wave voltage waveform applied to the piezoelectric element 202 for vibration. In addition, the control unit 70 can determine a duty value with which the passage timing interval between droplets is optimum.

5.2 Operation

In the droplet generator assembly work process, a worker adjusts each pin load spring 310 at room temperature such that the pin load becomes equal to a predetermined load, and attaches the piezoelectric unit 88 to the nozzle 80. Thereafter, the droplet generator 19 including the piezoelectric unit 88 is disposed in the chamber 16.

After the droplet generator 19 is fixed to the chamber 16, the tank 82 of the droplet generator 19 is heated to a temperature equal to or higher than the melting temperature of tin to fluidify solid tin inside the tank 82. After the tin inside the tank 82 is fluidified, predetermined pressure is applied to the tank 82 through the pressure regulator 90 to discharge the liquid tin through the nozzle hole 80a.

The control unit 70 sequentially changes the duty value of a rectangular-wave voltage waveform applied to the vibration piezoelectric element, and measures the droplet passage timing interval for each duty value.

The control unit 70 selects a duty value with which the droplet passage timing interval is optimum based on a result of the measurement of the droplet passage timing interval for each duty value, and sets the selected duty value as a duty value to be used in a subsequent EUV light emission process.

The rectangular-wave voltage waveform of the optimum duty value thus selected is used to drive the piezoelectric element 202, thereby promoting droplet coalescence and emitting EUV light through laser application to the coalescent droplet.

5.3 Exemplary Vibration Piezoelectric Element Duty Adjustment

Figure 5:
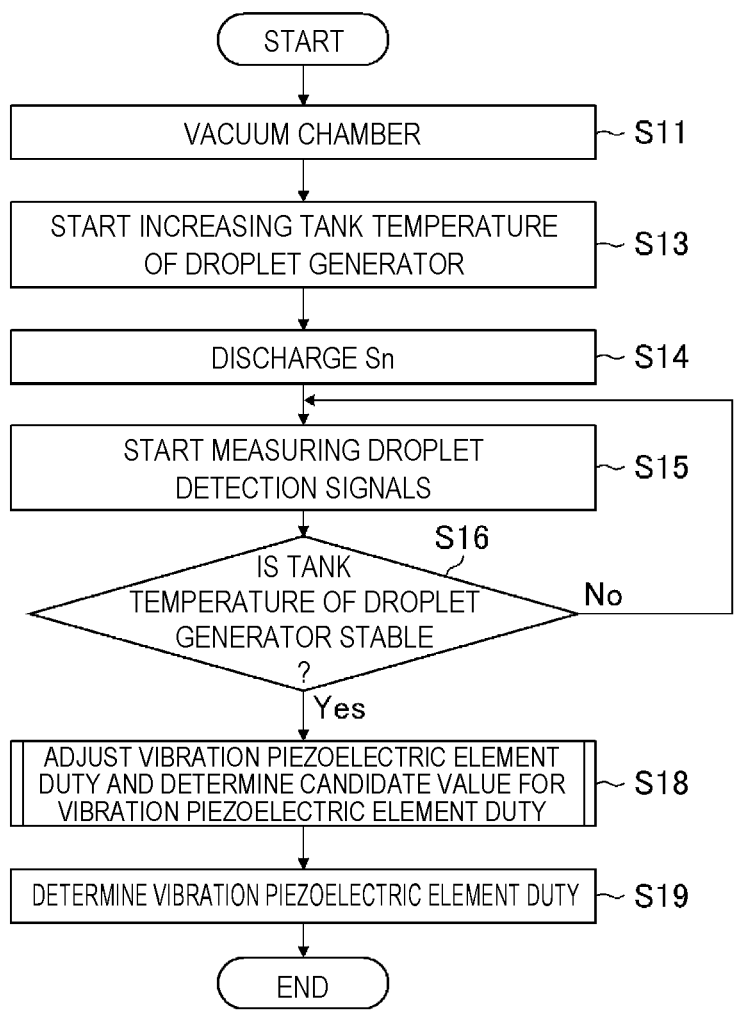
FIG. 5 is a flowchart illustrating exemplary processing contents of vibration piezoelectric element duty adjustment performed to determine a duty value suitable for droplet coalescence.

FIG. 5 is a flowchart illustrating exemplary processing contents of vibration piezoelectric element duty adjustment performed to determine a duty value suitable for droplet coalescence.

The flowchart illustrated in FIG. 5 is performed, for example, before EUV light emission after the droplet generator 19 including the piezoelectric unit 88 is attached to the chamber 16.

At step S11, the control unit 70 vacuums the chamber 16. The "vacuuming" means discharging gas from the chamber 16 so that the chamber 16 becomes vacuum.

Having received a target generation signal from the EUV light generation control unit 40, the control unit 70 starts increasing the temperature of the tank 82 of the droplet generator 19 at step S13. The control unit 70 heats the tank 82 to a predetermined temperature equal to or higher than the melting point of tin. The temperature of the tank 82 is detected by the tank temperature sensor 86 and is controlled by the tank temperature control unit 94. Thereafter, at step S14, the control unit 70 controls the pressure regulator 90 to apply predetermined argon pressure to the tank 82 so that tin (Sn) as the target substance is discharged through the nozzle 80.

At step S15, the control unit 70 starts measuring droplet detection signals. Each droplet detection signal may be a passage timing signal indicating the timing at which a droplet passes through the predetermined position P on the droplet trajectory. The control unit 70 measures the passage timing interval between droplets based on the droplet detection signals.

At step S16, the control unit 70 determines whether the tank temperature of the droplet generator 19 is stable. When the determination is negative at step S16, in other words, when the tank temperature is determined to be not stable, the control unit 70 returns to step S15.

When the determination is positive at step S16, in other words, when the tank temperature is determined to be stable, the control unit 70 proceeds to step S18.

At step S18, the control unit 70 performs the duty adjustment of a voltage waveform applied to drive the piezoelectric element 202 for vibration. The duty of a voltage waveform applied to the vibration piezoelectric element is referred to as a "vibration piezoelectric element duty". The duty adjustment performed to determine the vibration piezoelectric element duty suitable for droplet generation is referred to as "vibration piezoelectric element duty adjustment".

The vibration piezoelectric element duty adjustment includes a process of applying rectangular wave having a rated frequency and a rated voltage to the piezoelectric element 202, sequentially changing the duty value of the rectangular wave by a predetermined unit change amount in a predetermined range, and searching for a duty value for reliable droplet coalescence. The unit change amount is an amount per duty value change, in other words, the step width of duty value change performed in stages. At step S18, the control unit 70 performs the vibration piezoelectric element duty adjustment and determines a candidate value for an optimum vibration piezoelectric element duty.

At step S19, the control unit 70 determines an optimum vibration duty as a drive condition of the piezoelectric element 202 and ends the flowchart of FIG. 5.

Figure 6:
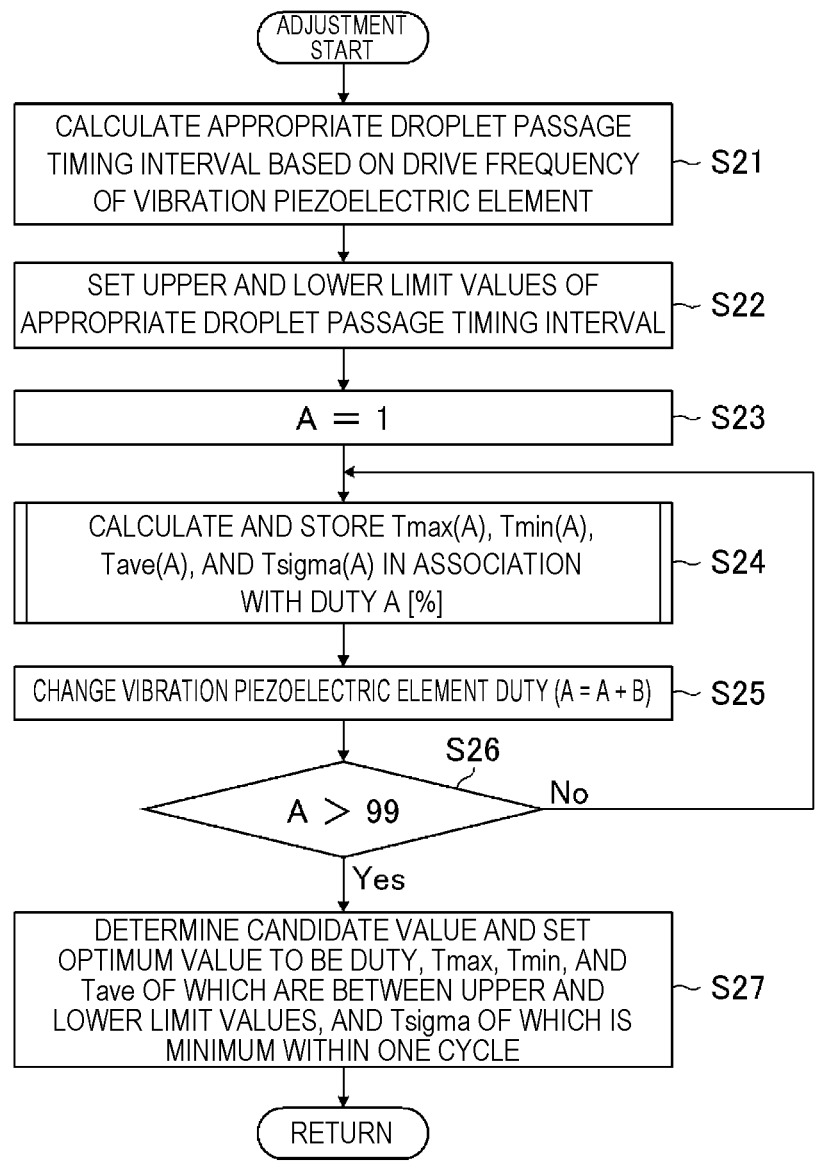
FIG. 6 is a flowchart illustrating exemplary processing contents at step S18 in FIG. 5.

FIG. 6 is a flowchart illustrating exemplary processing contents at step S18 in FIG. 5.

At step S21, the control unit 70 calculates an appropriate droplet passage timing interval based on the drive frequency of the vibration piezoelectric element. The appropriate droplet passage timing interval is an ideal designed droplet passage timing interval predicted based on the drive frequency of the vibration piezoelectric element and the droplet speed.

At step S22, the control unit 70 sets upper and lower limit values of the appropriate droplet passage timing interval. The upper and lower limit values means the upper limit value and the lower limit value. For example, the control unit 70 may set the upper and lower limit values to be values at "±15%" of the ideal designed droplet passage timing interval predicted based on the drive frequency and the droplet speed. In other words, the control unit 70 may set the appropriate droplet passage timing interval ±15% as an appropriate range of the droplet time interval. The processing at step S22 is exemplary processing of setting the appropriate range. The appropriate range of the droplet passage timing interval may be the allowed range of the appropriate droplet passage timing interval.

At step S23, the control unit 70 sets a variable parameter A representing the duty value to 1 [%]. The initial value of A is "1" in this example but may be a value other than "1".

At step S24, with the duty A % being set, the control unit 70 measures a droplet passage timing interval T, calculates Tmax(A), Tmin(A), Tave(A), and Tsigma(A) in association with the duty A %, and stores data of these values.

The control unit 70 drives the vibration piezoelectric element power source 96 based on the set duty A [%]. As the vibration piezoelectric element power source 96 is driven based on the set duty A [%], droplets are generated and droplet detection signals are output from the droplet detection device 76.

The control unit 70 measures the passage timing intervals T(1), T(2), . . . , T(Cmax) of the droplets based on the droplet detection signals. The value C in the passage timing interval T(C) represents the number of times of measurement of the passage timing interval. The value of Cmax as the upper limit value of C is an integer that can be determined in advance. For example, Cmax may be a value of 3 to 10000 inclusive. The passage timing interval T(C) for the integer C can be defined by the time interval t(C+1)−t(C) between the passage timing t(C) of the C-th droplet and the passage timing t(C+1) of the (C+1)-th droplet. The passage timing intervals T(1), T(2), . . . , T(Cmax) measured by the control unit 70 are exemplary measured passage timing interval values.

The control unit 70 may store the measured passage timing intervals T(1), T(2), . . . , T(Cmax). In addition, the control unit 70 calculates a maximum passage timing interval Tmax, a minimum passage timing interval Tmin, a passage timing interval average value Tave, and a passage timing interval variance Tsigma based on the passage timing intervals T(1), T(2), . . . , T(Cmax). The variance Tsigma may be σ as standard deviation or may be 3σ, which is three times larger than standard deviation.

The control unit 70 stores the calculated Tmax, Tmin, Tave, and Tsigma in association with the duty A [%] as Tmax(A), Tmin(A), Tave(A), and Tsigma(A), respectively. The contents of the processing at step S24 will be described later with reference to FIG. 7.

At step S25 in FIG. 6, the control unit 70 updates the value of the variable A of the duty A % by adding B to A. In other words, A+B is set to be a new value of A. The value B is the unit change amount of change of the variable A, in other words, the change amount per change (step). The numerical range of A used in the vibration piezoelectric element duty adjustment is 1% to 99% in reality. The value B is, for example, 0.1% or 0.2%. The value B may be 0.01% or 1%, depending on cases. In the present example, B is 0.1%, the duty value A is changed in the range of 1% to 99%, and data of Tmax(A), Tmin(A), Tave(A), and Tsigma(A) is acquired for each of 981 different duty values in total.

The control unit 70 sequentially changes setting of the duty A from the initial value of 1 [%] to 99 [%] at the step width B of 0.1 [%] and performs the processing at step S24 for each duty value.

At step S26, the control unit 70 determines whether the value A exceeds 99 [%]. When the value A is equal to or smaller than 99 [%], the control unit 70 returns to step S24. Until the duty A exceeds 99 [%], the processing at steps S24 to S26 is repeated.

Having determined that the duty A exceeds 99 [%] at step S26, the control unit 70 proceeds to step S27.

At step S27, the control unit 70 determines a candidate value for an optimum duty based on a calculation result of the passage timing interval for each duty examined in a range in which the duty A is within 1 to 99 [%]. For example, the candidate value determination finds a candidate value for the optimum duty, Tmax(A), Tmin(A), and Tave(A) of which are in the appropriate range defined by the upper and lower limit values of the appropriate droplet passage timing interval, and sets an optimum value to be the duty value, Tsigma(A) of which is minimum within one cycle among the candidate values. The "one cycle" is the duration in which a predetermined number of passage timing intervals T(1), T(2), . . . , T(Cmax) are measured.

After having specified the optimum value of the duty value at step S27, the control unit 70 ends the flowchart of FIG. 6 and may return to the flowchart of FIG. 5.

Figure 7:
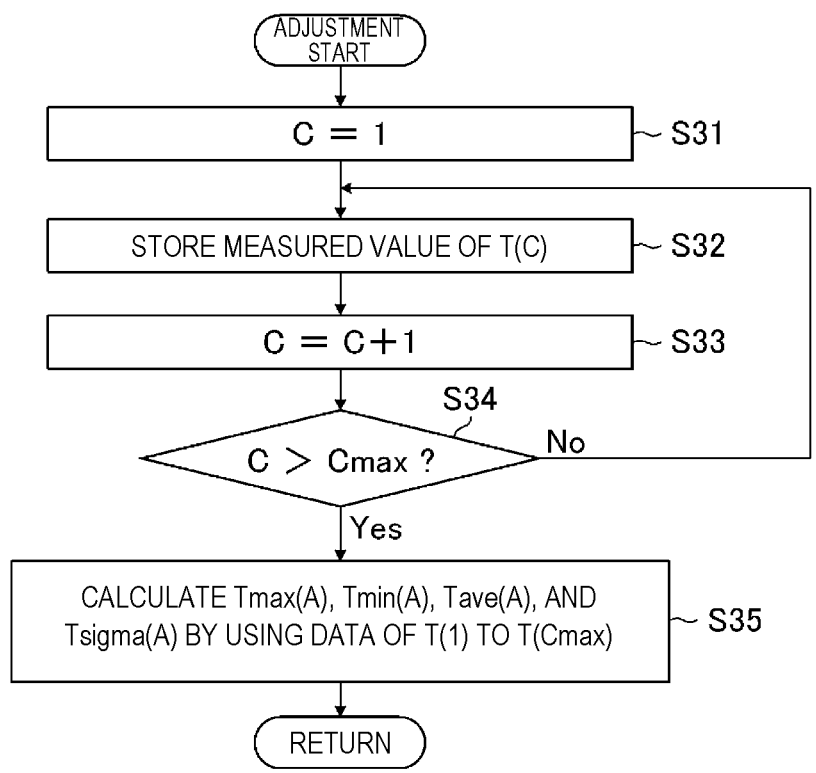
FIG. 7 is a flowchart illustrating exemplary processing contents at step S24 in FIG. 6.

FIG. 7 is a flowchart illustrating exemplary contents of the processing at step S24 in FIG. 6. At step S31 in FIG. 7, the control unit 70 sets a variable parameter C to be "1" as the initial value.

At step S32, the control unit 70 stores a measured value of the passage timing interval T(C).

At step S33, the control unit 70 increases the value C by "+1" and sets C+1 to be a new value C.

At step S34, the control unit 70 determines whether the value C exceeds a predetermined defined value Cmax. The value Cmax may be set to be an optional integer that defines the maximum number of times of measurement of the passage timing interval. For example, Cmax may be set to be an appropriate value in the range of 3 to 10000. Having determined that C is equal to or smaller than Cmax at step S34, the control unit 70 returns to step S32.

Having determined that C is larger than Cmax at step S34, the control unit 70 proceeds to step S35.

At step S35, the control unit 70 calculates Tmax(A), Tmin(A), Tave(A), and Tsigma(A) by using data of T(1) to T(Cmax). The control unit 70 stores Tmax(A), Tmin(A), Tave(A), and Tsigma(A) thus calculated. Tmax(A) corresponds to the maximum value in a droplet detection interval. Tmin(A) corresponds to the minimum value in the droplet detection interval. Tave(A) corresponds to an average value in the droplet detection interval. Tsigma(A) corresponds to variance of the droplet detection interval. After step S35, the control unit 70 returns to the flowchart of FIG. 6.

6. Problem

In the configuration of the piezoelectric unit 88 illustrated in FIG. 4, the temperature of each of the vibration transfer component 301, the pin 302, the piezoelectric element 202, the vibration piezoelectric element fixing member 304, the vibration piezoelectric element holding bolt 306, and the pin load spring 310 can be maintained in a temperature range sufficiently low as compared to the temperature of the tank 82 due to the effect of cooling water.

In contrast, the temperature of each of the pin load bolts 308, the supporting component 314, and the nozzle 80 do not receive the effect of cooling water and can be relatively high as compared to the temperature of the low-temperature component group such as the vibration transfer component 301. Each pin load bolt 308 of the piezoelectric unit 88 is also heated through the tank temperature increase (refer to step S13 in FIG. 5) for melting tin in the tank 82, and the length of the pin load bolt 308 extends due to thermal expansion as compared to that at room temperature.

As the pin load bolt 308 extends, the deflection amount of the pin load spring 310 decreases, and accordingly, the pin load decreases as compared to that at room temperature.

As the pin load decreases, the efficiency of vibration transfer from the piezoelectric unit 88 to the nozzle 80 also degrades, and the range of the duty value at which droplet coalescence is promoted becomes "0" or extremely small. The range of the duty value at which droplet coalescence is promoted can be expressed by the number of duty values satisfying a condition under which droplet coalescence is promoted. The number of candidate values for the optimum duty, which are calculated at step S27 in FIG. 6 corresponds to the number of duty values satisfying the condition under which droplet coalescence is promoted, and can be used as an index indicating the range of the duty value at which droplet coalescence is promoted.

The range of the duty value at which droplet coalescence is promoted reflects the number of duty value candidates usable in the EUV light emission process. When the range of the duty value at which droplet coalescence is promoted is "0", EUV light emission is impossible, which is a problem.

Furthermore, when the duty value at which droplet coalescence is promoted exists but the range thereof is extremely small, robustness of the droplet generator 19 against various disturbances during droplet discharge significantly decreases and droplet coalescence becomes unstable. As a result, EUV light emission becomes unstable, which is another problem.

Examples of disturbances during droplet discharge include variation in the pin load, which is attributable to variation in the length of each pin load bolt 308 due to radiation heat along with EUV light emission.

7. Embodiment 1

7.1 Configuration

Figure 8:
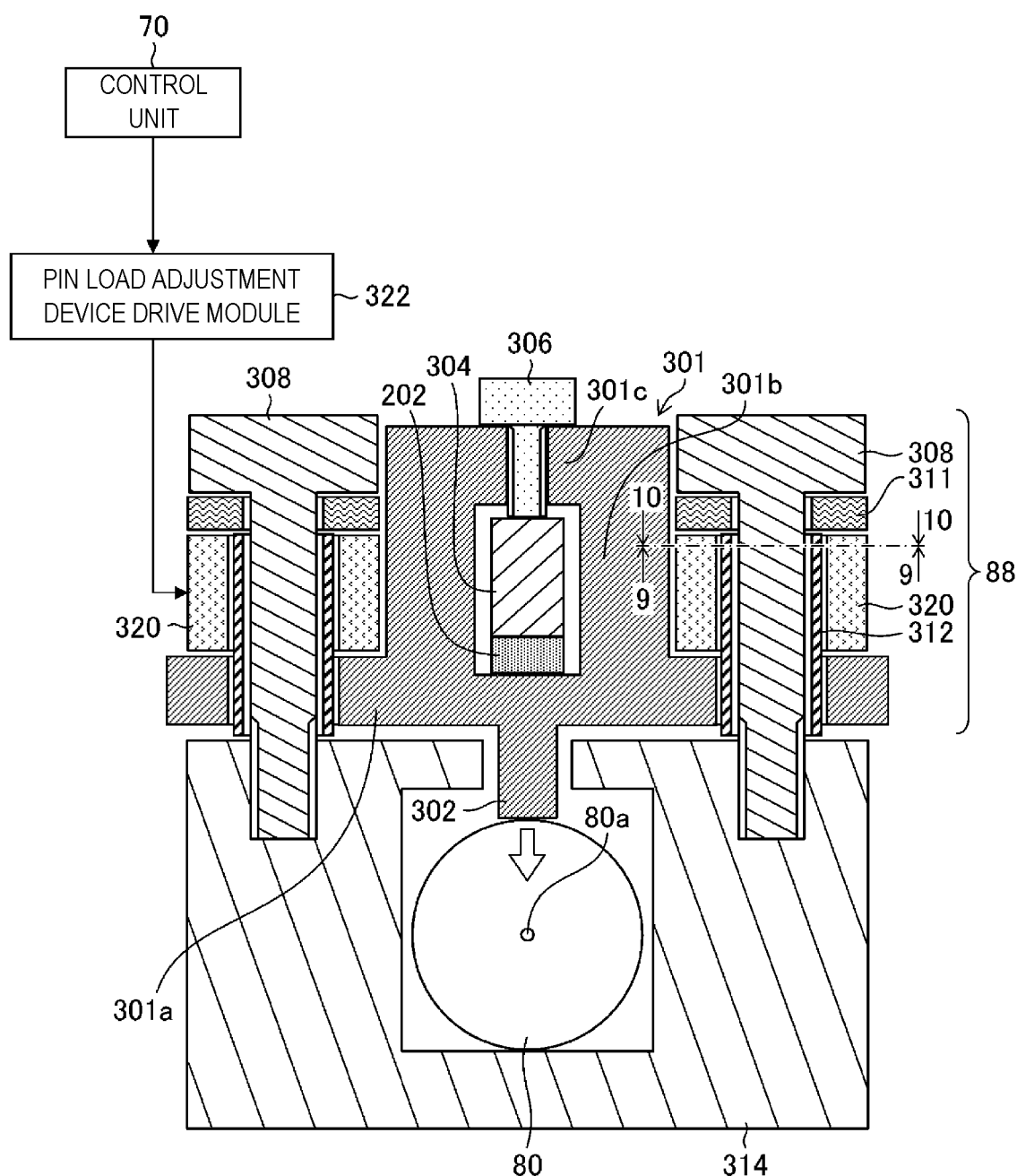
FIG. 8 is a cross-sectional view schematically illustrating the configuration of the piezoelectric unit used in the target supply device according to Embodiment 1.

FIG. 8 schematically illustrates the configuration of the piezoelectric unit used in the target supply device according to Embodiment 1. Differences from the configuration illustrated in FIG. 4 will be described below.

The piezoelectric unit 88 in Embodiment 1 illustrated in FIG. 8 includes, in place of the pin load spring 310 in FIG. 4, a pin load adjustment device 320 capable of generating and adjusting force that presses the pin 302 against the nozzle 80. The pin load adjustment device 320 is disposed at each of the two pin load bolts 308. In other words, the piezoelectric unit 88 in Embodiment 1 includes the two pin load adjustment devices 320.

The target supply device according to Embodiment 1 includes a pin load adjustment device drive module 322 configured to supply a signal for driving each pin load adjustment device 320 to the pin load adjustment device 320. The pin load adjustment device drive module 322 is connected with the control unit 70.

The control unit 70 can output, to the pin load adjustment device drive module 322, a pin load adjustment device control signal with which the force generated by each pin load adjustment device 320 is equal to a predetermined force.

The pin load adjustment device drive module 322 supplies, in accordance with the pin load adjustment device control signal commanded by the control unit 70, a pin load adjustment device drive input signal with which each pin load adjustment device 320 generates force to the pin load adjustment device 320.

Each pin load adjustment device 320 may be an electricity-machine conversion element such as a piezoelectric element or a magnetostrictive element, a device configured to generate force by using air pressure, oil pressure, water pressure, or the like, or a device configured to generate force by rotation of a screw or the like. The device configured to generate force by using air pressure is referred to as an air-pressure element. The device configured to generate force by using oil pressure is referred to as an oil-pressure element. The device configured to generate force by using water pressure is referred to as a water-pressure element. The device configured to generate force by screw rotation is referred to as a screw element. Actuators in various forms may be employed as the pin load adjustment device 320.

Each pin load adjustment device 320 is disposed at a position where the generated force is transferred to the pin 302. In the example illustrated in FIG. 8, the pin load adjustment device 320 is disposed between the neck of the pin load bolt 308 and the plate part 301a of the vibration transfer component 301. When the pin load adjustment device 320 is disposed at this place, the force generated by the pin load adjustment device 320 is transferred to the pin 302 through the plate part 301a of the vibration transfer component 301.

Figure 9:
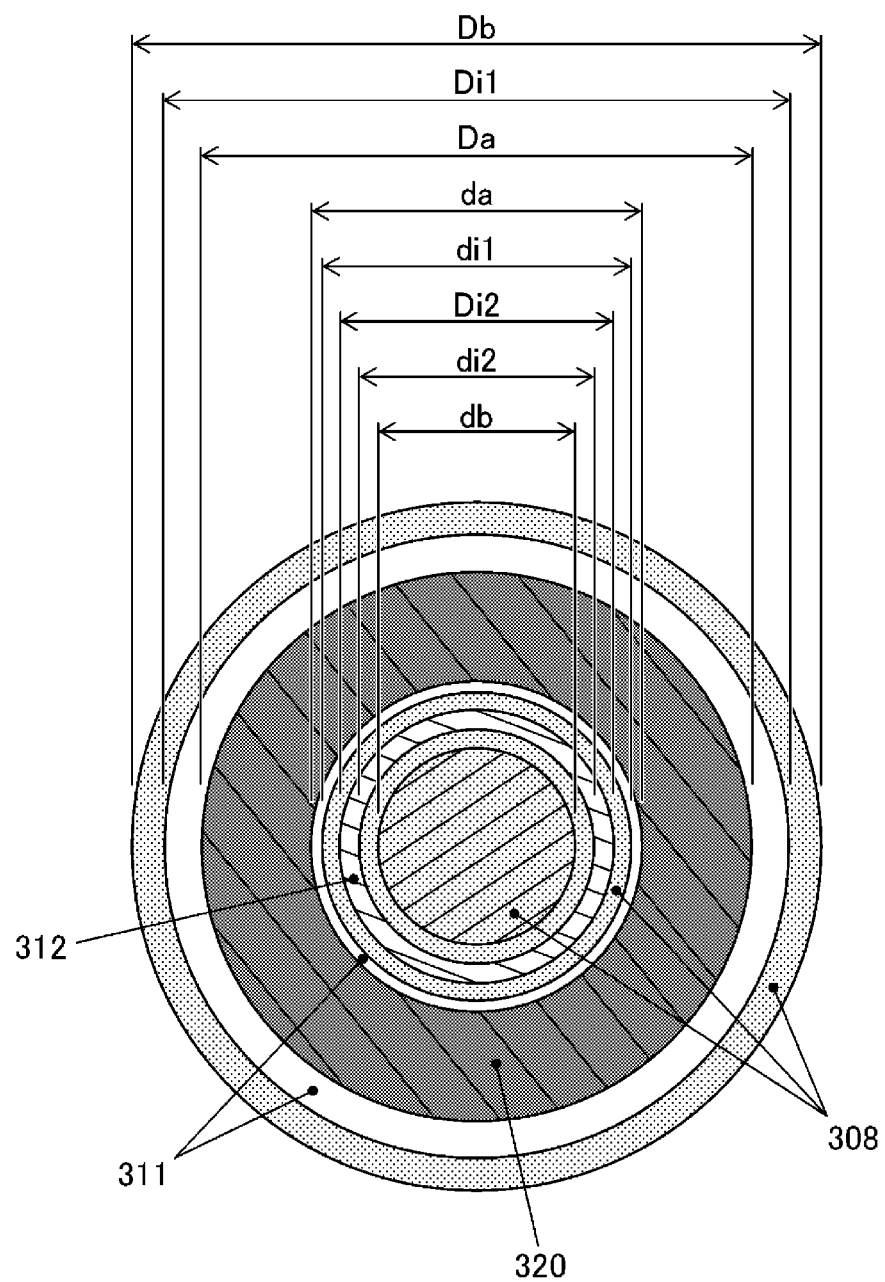
FIG. 9 is a cross-sectional view taken along line 9-9 in FIG. 8.
Figure 10:
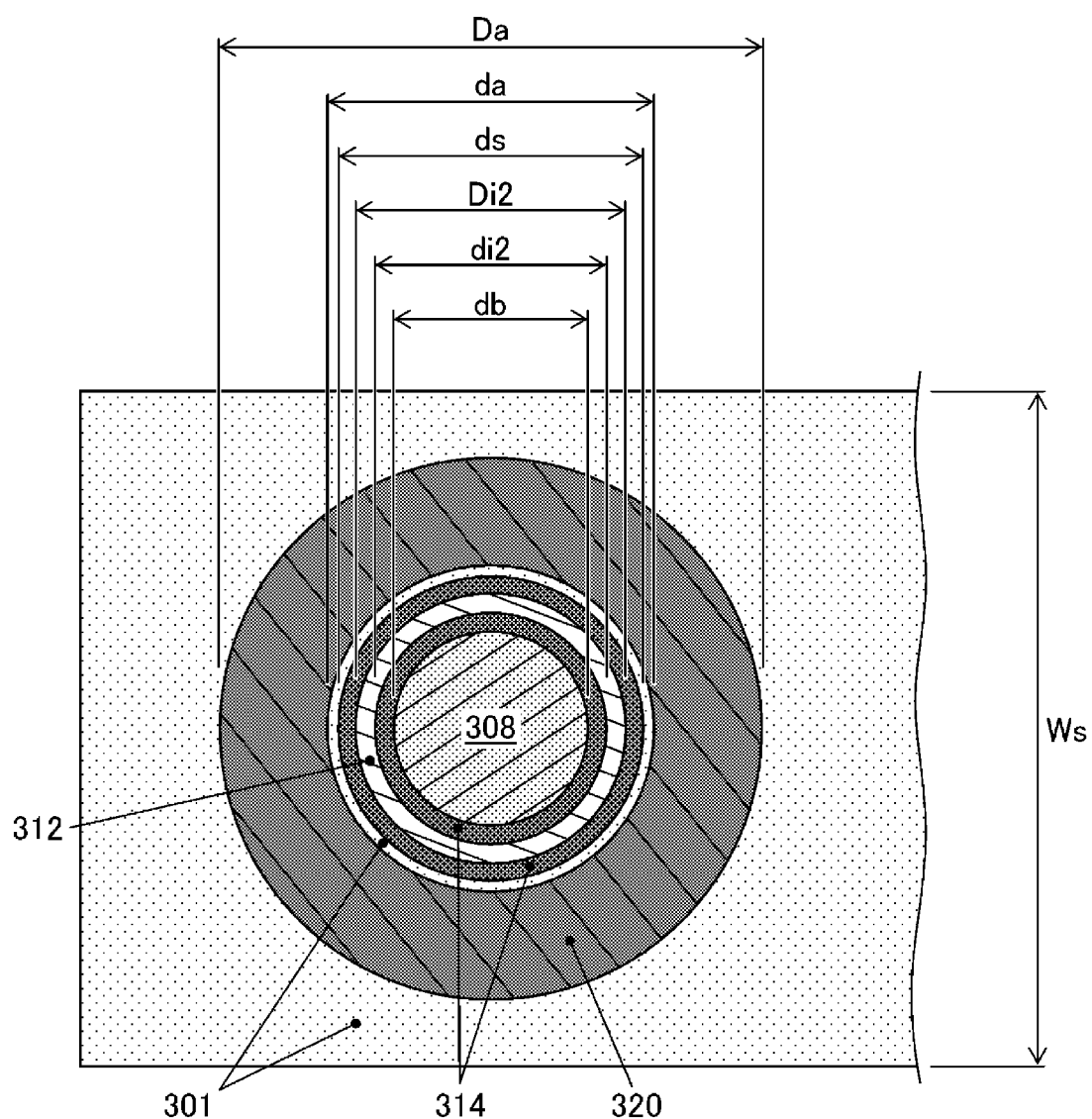
FIG. 10 is a cross-sectional view taken along line 10-10 in FIG. 8.

FIG. 9 is a cross-sectional view taken along line 9-9 in FIG. 8. FIG. 10 is a cross-sectional view taken along line 10-10 in FIG. 8. In FIGS. 9 and 10, in order to clearly indicate the relation between members, parts belonging to an identical member are illustrated by an identical coloring scheme, and sections thereof are hatched.

In FIGS. 9 and 10, the dimensions of each of the pin load bolt 308, the first heat insulation component 311, the second heat insulation component 312, the pin load adjustment device 320, and the vibration transfer component 301 are as follows.

TABLE 1

| Component | Dimensions |
| --- | --- |
| Pin load bolt 308 | Head-part outer diameter Db, nominal diameter db |
| First heat insulation component 311 | Outer diameter Di1, inner diameter di1 |
| Second heat insulation component 312 | Outer diameter Di2, inner diameter di2 |
| Pin load adjustment device 320 | Outer diameter Da, inner diameter da |
| Vibration transfer component 301 | Width Ws, inner diameter ds |

As illustrated in FIG. 9, the dimensions of each of the pin load bolt 308, the first heat insulation component 311, the second heat insulation component 312, and the pin load adjustment device 320 satisfy a relation expressed in Expression 1 below:

$$db \leq di2 < Di2 \leq di1 \leq da < Da \leq Di1 \leq Db \quad (1)$$

In addition, as illustrated in FIG. 10, the dimensions of each of the pin load bolt 308, the vibration transfer component 301, the second heat insulation component 312, and the pin load adjustment device 320 satisfies a relation expressed in Expression 2 below:

$$db \leq di2 < Di2 \leq ds \leq da < Da \leq Ws \quad (2).$$

7.2 Operation

After increase of the tank temperature of the droplet generator 19 is completed, each pin load adjustment device 320 in the target supply device according to Embodiment 1 is extended by a length corresponding to extension of the pin load bolt 308 to generate force that corrects decrease of the pin load due to the extension of the pin load bolt 308.

When droplet coalescence instability attributable to pin load variation due to disturbances during EUV light emission occurs, the length of the pin load adjustment device 320 is adjusted to stabilize droplet coalescence, thereby adjusting the force generated by the pin load adjustment device 320 and thus the pin load.

The force generated by the pin load adjustment device 320 is desirably constant force having no periodic variation except for an adjustment transition duration. Thus, the constant force is desirably achieved with a pin load adjustment device drive input supplied from the pin load adjustment device drive module 322 to the pin load adjustment device 320 as well. For example, when the pin load adjustment device 320 is a piezoelectric element, direct-current voltage as the pin load adjustment device drive input is supplied from the pin load adjustment device drive module 322.

In the configuration of Embodiment 1, the piezoelectric unit 88 is an exemplary "vibration unit" in the present disclosure. The pin 302 is an exemplary "vibration transfer unit" in the present disclosure. The pin load bolt 308 is an exemplary "load application member" in the present disclosure. The pin load adjustment device 320 is an exemplary "load adjustment device" in the present disclosure. The pin load adjustment device drive input supplied from the pin load adjustment device drive module 322 to the pin load adjustment device 320 is an exemplary "signal from outside" in the present disclosure.

"During EUV light emission" means the light emission duration of EUV light. When EUV light emission is performed by burst drive, a burst duration corresponds to the "light emission duration". A burst operation in the burst drive is an operation in which a burst duration and a stop duration are repeated, the burst duration being a duration in which EUV light is output at a constant repetition frequency for a certain duration, the stop duration being a duration in which no EUV light is output for a predetermined duration. One burst duration is referred to as one burst. In the burst duration, a laser beam can be output from the laser apparatus 14. In the stop duration, the outputting of a laser beam from the laser apparatus 14 is stopped. Alternatively, in the stop duration, propagation of a laser beam to the plasma generating region 26 may be prevented. A burst pattern can be defined by data including any one or a plurality of the energy of EUV light, the repetition frequency, and the number of pulses in the burst duration, the length of the burst stop duration, and the number of bursts. The burst pattern may be instructed by the exposure apparatus 46.

7.3 Effect

With the target supply device according to Embodiment 1, after increase of the temperature of the droplet generator 19, the amount of expansion and contraction of the pin load adjustment device 320 is changed to correct the pin load. Accordingly, decrease of the pin load due to temperature increase can be reduced. As a result, decrease of droplet coalescence performance due to temperature increase can be reduced.

Moreover, with the target supply device according to Embodiment 1, it is possible to adjust variation in the pin load due to disturbances during EUV generation and reduce droplet coalescence instability attributable to the pin load variation, thereby stabilizing droplet coalescence. As a result, EUV light emission can be stabilized.

8. Embodiment 2

8.1 Configuration

Figure 11:
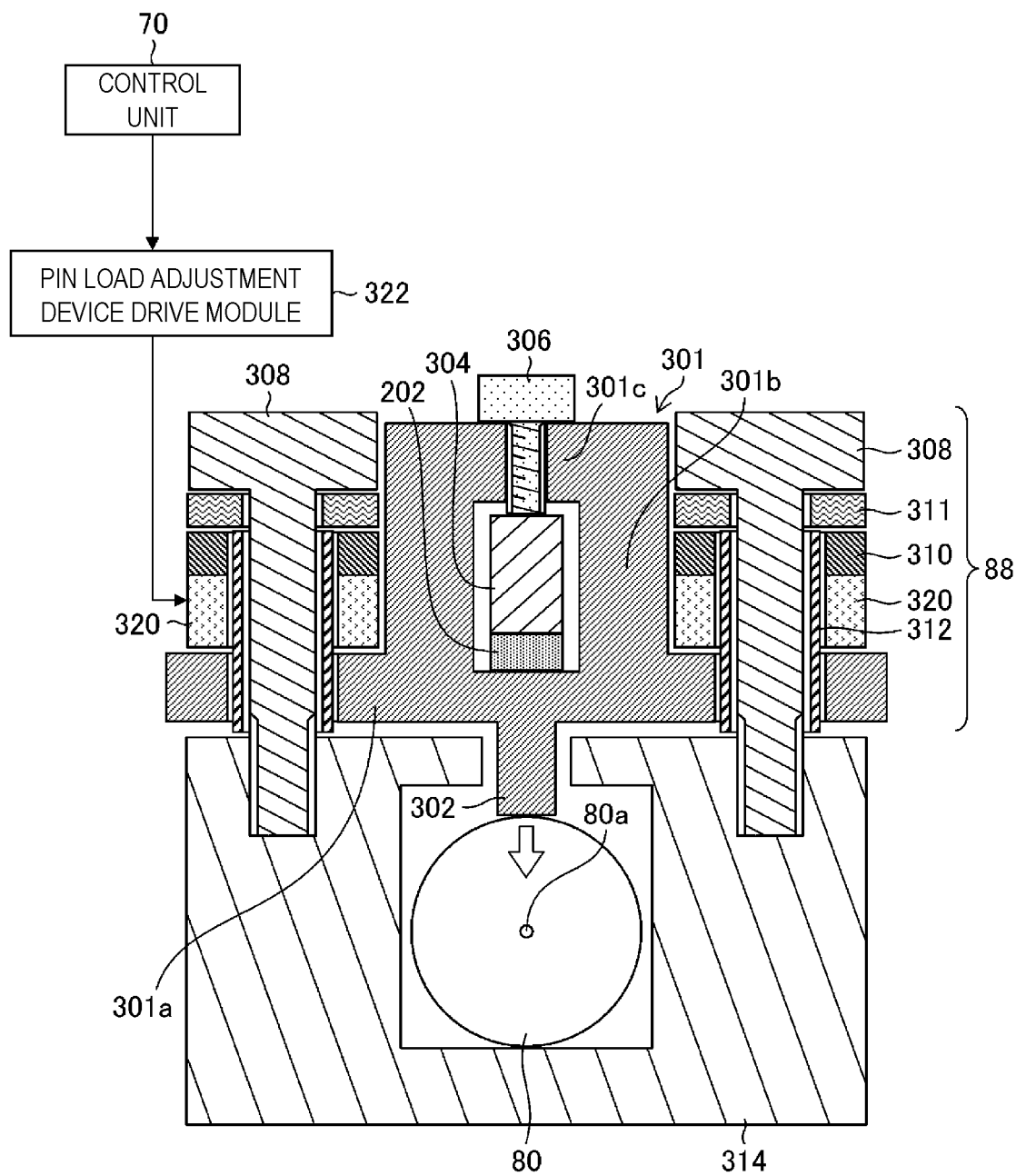
FIG. 11 is a cross-sectional view schematically illustrating the configuration of the target supply device according to Embodiment 2.

FIG. 11 schematically illustrates the configuration of the target supply device according to Embodiment 2. Differences from Embodiment 1 described with reference to FIG. 8 will be described below. In Embodiment 2 illustrated in FIG. 11, a pin load spring and a pin load adjustment device are both used.

Each pin load spring 310 is disposed such that force generated by the corresponding pin load adjustment device 320 and force generated by the pin load spring 310 are applied in series. Being "in series" means that the forces are generated in parallel. The configuration in which the pin load spring 310 and the pin load adjustment device 320 are arranged in an overlapping manner in the direction of force generation is an exemplary configuration "in series".

For example, each pin load spring 310 is disposed at one or both of a position between the neck of the pin load bolt 308 and the pin load adjustment device 320 and a position between the pin load adjustment device 320 and the plate part 301a of the vibration transfer component 301. FIG. 11 illustrates an example in which the pin load spring 310 is disposed between the neck of the pin load bolt 308 and the pin load adjustment device 320. The other configuration is the same as that in Embodiment 1.

8.2 Operation

The operation of the target supply device according to Embodiment 2 is the same as that in Embodiment 1. In addition, each pin load spring 310 autonomously expands and contracts by elastic energy stored in the spring and an external load. Specifically, the pin load spring 310 does not need inputting of an external signal for expansion and contraction but promptly expands and contracts in response to variation in the external load. With the configuration of Embodiment 2, variation in the pin load is reduced by the elastic force and stroke of the pin load spring 310 even when the pin load bolt 308 is extended by thermal expansion.

The pin load spring 310 is an exemplary "elastic member configured to press the vibration transfer unit against the nozzle" in the present disclosure.

8.3 Effect

With the target supply device according to Embodiment 2, it is possible to obtain effects same as those in Embodiment 1. In addition, in Embodiment 2, variation in the pin load is further reduced as compared to Embodiment 1.

9. Embodiment 3

9.1 Configuration

Figure 12:
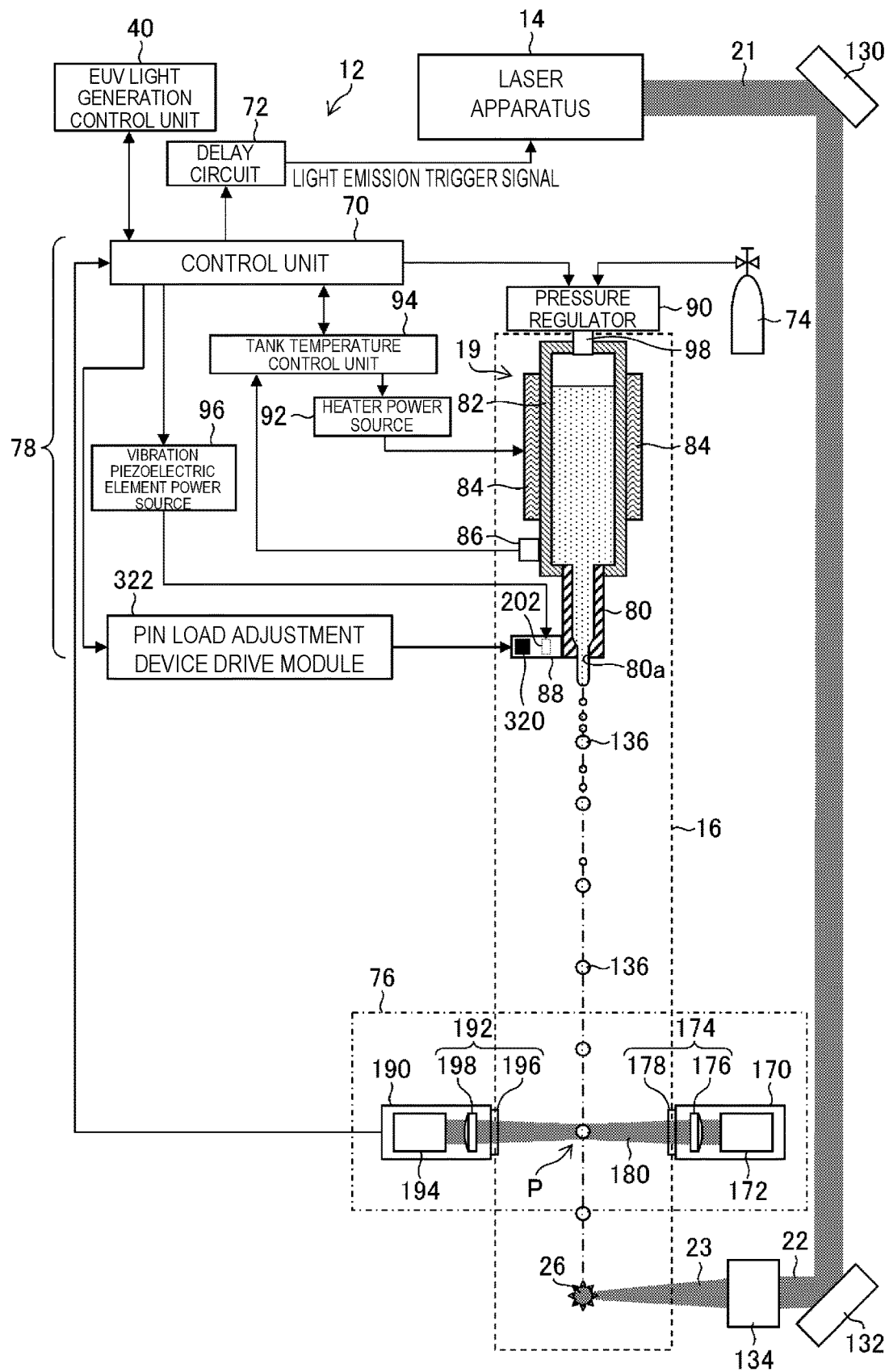
FIG. 12 is a diagram schematically illustrating the configuration of the EUV light generation apparatus including the target supply device according to Embodiment 3.

FIG. 12 schematically illustrates the configuration of the EUV light generation apparatus including the target supply device according to Embodiment 3. Differences from the configuration described with reference to FIG. 3 will be described below.

The target supply device 78 according to Embodiment 3 illustrated in FIG. 12 includes the piezoelectric unit 88 including the pin load adjustment device 320, the pin load adjustment device drive module 322, and the control unit 70 capable of outputting a pin load adjustment device control signal to the pin load adjustment device drive module 322, which are illustrated in FIG. 11.

The control unit 70 can determine a droplet coalescence state based on droplet detection signals from the droplet detection device 76. The control unit 70 can determine the pin load adjustment device control signal based on a result of the determination of the droplet coalescence state.

9.2 Operation

In the droplet generator assembly work process, a worker adjusts each pin load spring 310 at room temperature such that the pin load becomes equal to a predetermined load, and attaches the piezoelectric unit 88 to the nozzle 80. Thereafter, the droplet generator 19 including the piezoelectric unit 88 is disposed in the chamber 16.

Then, in the target supply device 78 according to Embodiment 3, after increase of the tank temperature of the droplet generator 19 is completed, each pin load adjustment device 320 is extended by a length corresponding to extension of the pin load bolt 308. Accordingly, the pin load adjustment device 320 generates force that corrects decrease of the pin load due to the extension of the pin load bolt 308. The amount of extension of the pin load adjustment device 320 by a length corresponding to extension of the pin load bolt 308 may be a defined amount assumed in advance. In other words, the force generated by the pin load adjustment device 320 may have a defined magnitude set in advance. The force generated by the pin load adjustment device 320 is desirably constant force having no periodic variation except for the adjustment transition duration.

Thus, the constant force is desirably achieved with a pin load adjustment device drive input supplied from the pin load adjustment device drive module 322 to the pin load adjustment device 320 as well. For example, when the pin load adjustment device 320 is a piezoelectric element, direct-current voltage as the pin load adjustment device drive input is supplied from the pin load adjustment device drive module 322.

Thereafter, the control unit 70 performs the vibration piezoelectric element duty adjustment and determines an optimum duty value.

9.3 Exemplary Vibration Piezoelectric Element Duty Adjustment

Figure 13:
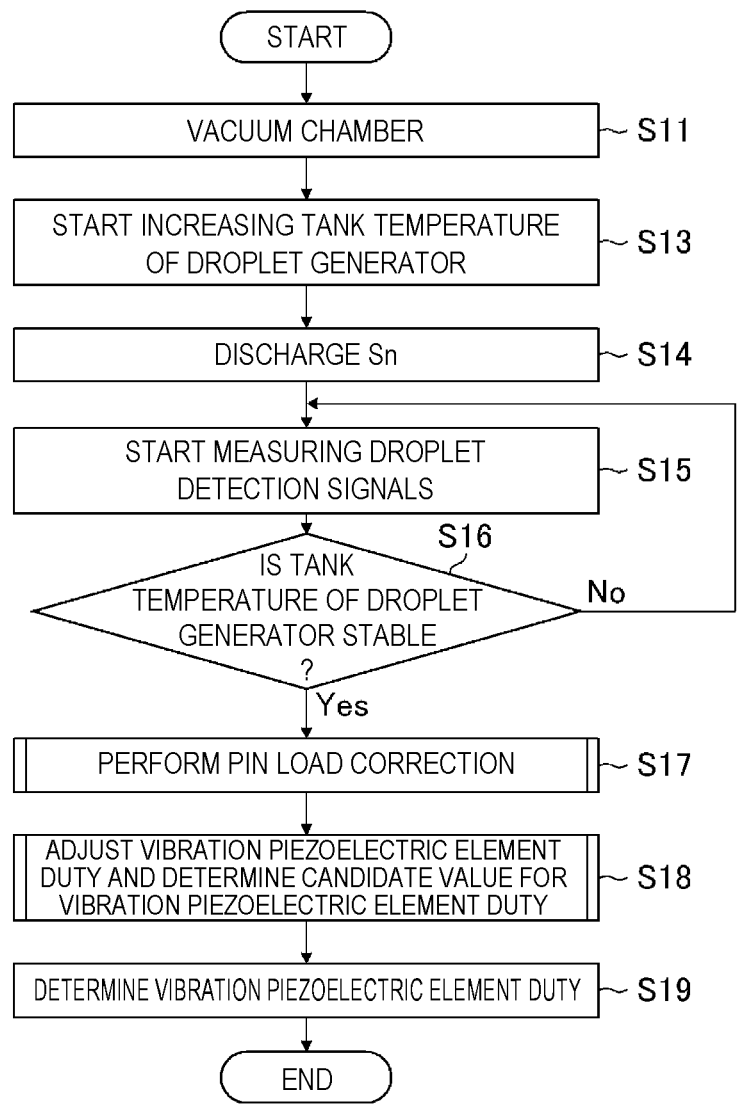
FIG. 13 is a flowchart illustrating exemplary processing contents from chamber vacuuming to vibration piezoelectric element duty determination in Embodiment 3.

FIG. 13 is a flowchart illustrating exemplary processing contents from chamber vacuuming to vibration piezoelectric element duty determination in Embodiment 3. Differences from the flowchart described with reference to FIG. 5 will be described below. In the flowchart illustrated in FIG. 13, the process of pin load correction at step S17 is added between steps S16 and S18.

At step S17, the control unit 70 performs processing for correcting decrease of the pin load along with increase of the tank temperature of the droplet generator 19.

Figure 14:
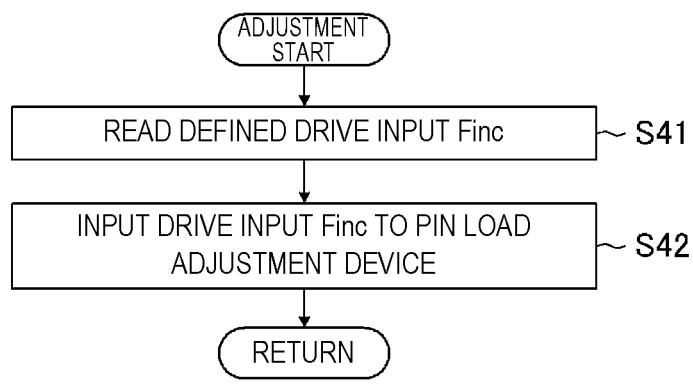
FIG. 14 is a flowchart illustrating exemplary processing contents of pin load correction at step S17 in FIG. 13.

FIG. 14 is a flowchart illustrating exemplary processing contents of the pin load correction at step S17 in FIG. 13. At step S41 in FIG. 14, the control unit 70 reads a defined drive input Finc. The defined drive input Finc may be, for example, a numerical value calculated by a method expressed in a formula below.

$$Finc = \beta \times \Delta Lc$$

$$\Delta Lc = (K2-K1) \times Lb \times \alpha \qquad \text{<Formula>}$$

where

K1: the tank temperature of the droplet generator before temperature increase

K2: the tank temperature of the droplet generator after temperature increase

Lb: the length of the pin load bolt before temperature increase

α: the thermal expansion coefficient of the pin load bolt

β: the amount of displacement per unit input

<Calculation Example Using Specific Numerical Values>

The following describes an example in which the value Finc is determined by using a specific numerical value for each parameter in the above formula. The parameter K1 is, for example, 20° C. The parameter K2 is, for example, 260° C. The parameter Lb is, for example, 20 mm. The parameter α is, for example, 5E-6 per Kelvin. The notation "E-6" means 10 to the negative sixth power. The parameter β is, for example, 0.15 μm/V. The value Finc is calculated to be 167 V by using these numerical conditions.

The value of the defined drive input Finc can be calculated as described above in advance and be stored in a memory of the control unit 70.

Then at step S42, the control unit 70 outputs, to the pin load adjustment device drive module 322, a pin load adjustment device control signal for inputting the drive input Finc to the pin load adjustment device 320. As a result, voltage of the drive input Finc is applied to the pin load adjustment device 320 through the pin load adjustment device drive module 322. After step S42, the control unit 70 returns to the flowchart of FIG. 13.

9.4 Effect

According to Embodiment 3, since the pin load can be corrected after increase of the temperature of the droplet generator, it is possible to reduce variance in the pin load among droplet generators, which is caused by decrease of the pin load along with the temperature increase, thereby reducing difference in droplet coalescence among the droplet generators.

As described above, according to Embodiment 3, it is possible to stabilize droplet coalescence and thus EUV light emission.

10. Embodiment 4

10.1 Configuration

The configuration of Embodiment 4 is the same as that of Embodiment 3.

10.2 Operation

In Embodiment 4, the length of extension of each pin load bolt is calculated based on the difference between the tank temperature of the droplet generator before temperature increase and the tank temperature of the droplet generator after temperature increase, and the amount of extension of the pin load adjustment device 320 is adjusted in accordance with the calculated length.

Figure 15:
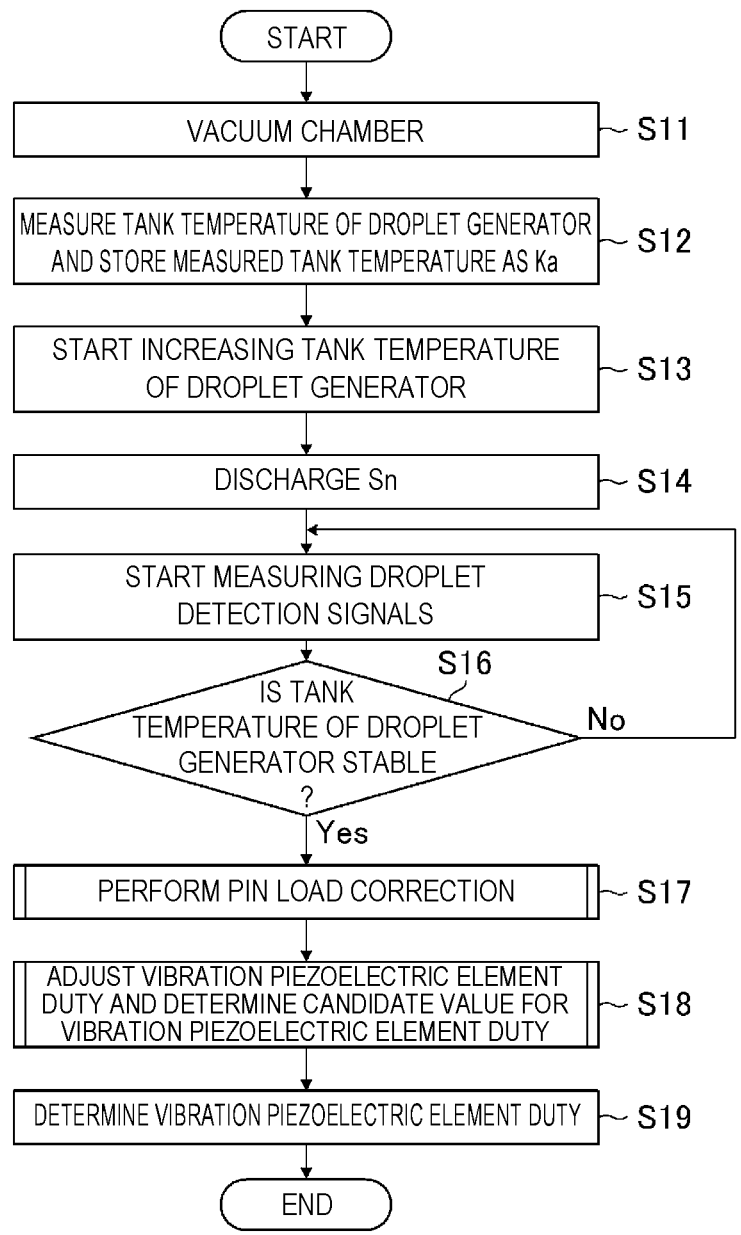
FIG. 15 is a flowchart illustrating exemplary processing contents from chamber vacuuming to vibration piezoelectric element duty determination in Embodiment 4.

FIG. 15 is a flowchart illustrating exemplary processing contents from chamber vacuuming to vibration piezoelectric element duty determination in Embodiment 4. Differences from the flowchart described with reference to FIG. 13 will be described below. In the flowchart illustrated in FIG. 15, the process at step S12 is added between steps S11 and S13. In addition, in the processing contents of pin load correction at step S17 in FIG. 15, the flowchart of FIG. 16 is applied in place of the flowchart of FIG. 13.

At step S12 in FIG. 15, the control unit 70 measures the tank temperature of the droplet generator 19 before temperature increase and stores the measured tank temperature as Ka. The control unit 70 acquires information of the tank temperature from the tank temperature sensor 86.

Figure 16:
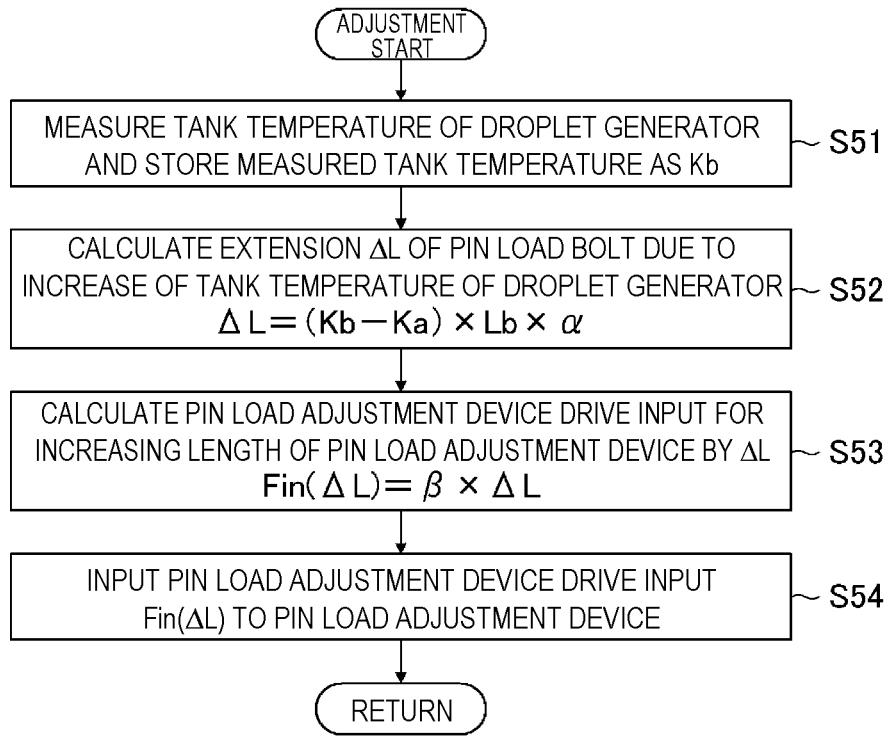
FIG. 16 is a flowchart illustrating exemplary processing contents of pin load correction at step S17 in FIG. 15.

FIG. 16 is a flowchart illustrating exemplary processing contents of the pin load correction at step S17 in FIG. 15.

At step S51 in FIG. 16, the control unit 70 measures the tank temperature of the droplet generator 19 and stores the measured tank temperature as Kb.

Subsequently at step S52, the control unit 70 calculates extension $\Delta L$ of each pin load bolt 308 due to increase of the temperature of the tank 82 of the droplet generator 19. The extension $\Delta L$ of the pin load bolt 308 can be obtained by using an expression below.

$$\Delta L = (Kb - Ka) \times Lb \times \alpha$$

where

Ka: the tank temperature of the droplet generator before temperature increase

Kb: the tank temperature of the droplet generator after temperature increase

Lb: the length of the pin load bolt before temperature increase

α: the thermal expansion coefficient of the pin load bolt

For example, $\Delta L$ is calculated to be 25 μm for Ka=20° C., Kb=260° C., Lb=20 mm, and α=5E-6 per Kelvin.

Subsequently at step S53, the control unit 70 calculates a pin load adjustment device drive input Fin($\Delta L$) for increasing the length of the pin load adjustment device 320 by the length $\Delta L$. The pin load adjustment device drive input Fin($\Delta L$) can be obtained by using an expression below.

$$Fin(\Delta L) = \beta \times \Delta L$$

where

Fin($\Delta L$): the pin load adjustment device drive input necessary for displacement by $\Delta L$ β: the amount of displacement per unit input For example, when the pin load adjustment device 320 is a piezoelectric element having a property of β=0.15 μm/V, the pin load adjustment device drive input Fin($\Delta L$) necessary for obtaining the amount of extension by the length 25 μm is 167 V.

Then at step S54, the control unit 70 outputs, to the pin load adjustment device drive module 322, a pin load adjustment device control signal for inputting the pin load adjustment device drive input Fin($\Delta L$) to the pin load adjustment device 320. As a result, voltage of Fin($\Delta L$) is applied to the pin load adjustment device 320 through the pin load adjustment device drive module 322. After step S54, the control unit 70 returns to the flowchart of FIG. 15.

10.3 Effect

According to Embodiment 4, since the pin load can be corrected after increase of the temperature of the droplet generator, it is possible to reduce variation in the pin load among droplet generators, which is caused by decrease of the pin load along with the temperature increase, thereby reducing difference in droplet coalescence among the droplet generators. Accordingly, it is possible to stabilize droplet coalescence and thus EUV light emission.

Moreover, in Embodiment 4, the amount of extension of each pin load adjustment device is adaptively controlled by using information of the actual tank temperature, and thus it is possible to perform pin load correction at higher accuracy than in Embodiment 3.

11. Embodiment 5

11.1 Configuration

The configuration of the target supply device according to Embodiment 5 is the same as the configurations according to Embodiments 3 and 4.

11.2 Operation

Embodiments 3 and 4 show an example in which the pin load correction is performed as a stage prior to the vibration piezoelectric element duty adjustment before EUV light emission. In Embodiment 5, the pin load adjustment device adjustment is performed when droplet coalescence instability attributable to pin load variation due to disturbances is detected by the droplet detection device during EUV light emission.

An overview of a specific adjustment method is as follows. In Embodiment 5, when droplet coalescence instability attributable to pin load variation due to disturbance is detected by the droplet detection device during EUV light emission, the droplet passage timing is first measured and then the pin load adjustment device 320 is extended or contracted once to increase or decrease the pin load once.

Then, when the droplet passage timing after the pin load change is more desirable than before the pin load change, the length of the pin load adjustment device 320 is changed in the same direction to change the pin load in the same direction. When the droplet passage timing after the pin load change is less desirable than before the pin load change, the length of the pin load adjustment device 320 is changed in the opposite direction to change the pin load in the opposite direction.

While sequentially changing the length of the pin load adjustment device 320, the control unit 70 repeats processing of determining the droplet coalescence state at each length to adjust the length of the pin load adjustment device 320, in other words, the pin load, until the optimal droplet passage timing is achieved.

Figure 17:
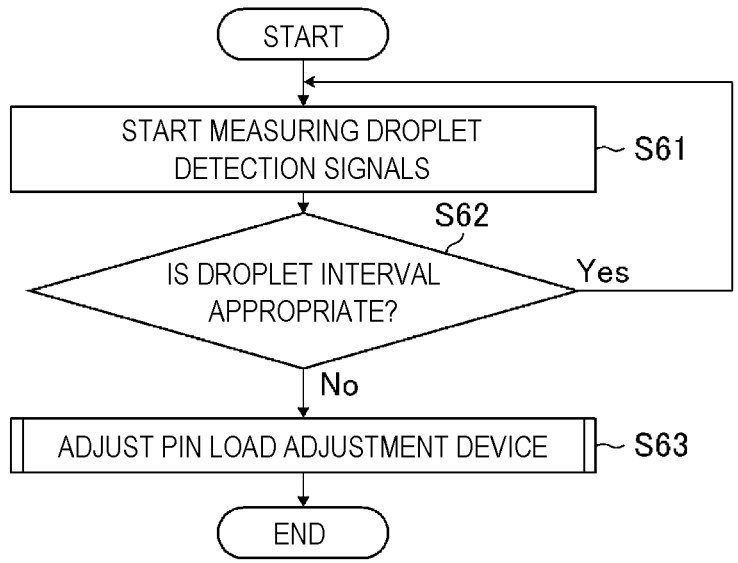
FIG. 17 is a flowchart illustrating exemplary processing contents of pin load adjustment during EUV light emission.

FIG. 17 is a flowchart illustrating exemplary processing contents of the pin load adjustment during EUV light emission.

The control unit 70 executes the flowchart of FIG. 17 during EUV light emission. At step S61, the control unit 70 starts measuring droplet detection signals.

At step S62, the control unit 70 determines whether the droplet interval is appropriate. The control unit 70 may determine whether the droplet interval is appropriate based on comparison between the passage timing interval between droplets measured based on the droplet detection signals and an appropriate droplet passage timing interval predicted in designing. Step S62 corresponds to a step at which the control unit 70 determines necessity of the pin load adjustment.

When the result of the determination at step S62 is positive, in other words, the droplet interval is appropriate, the pin load adjustment is unnecessary, and thus the control unit 70 returns to step S61.

When the result of the determination at step S62 is negative, in other words, the droplet interval is inappropriate, the control unit 70 proceeds to step S63 to perform adjustment processing of the pin load adjustment device 320.

Figure 18:
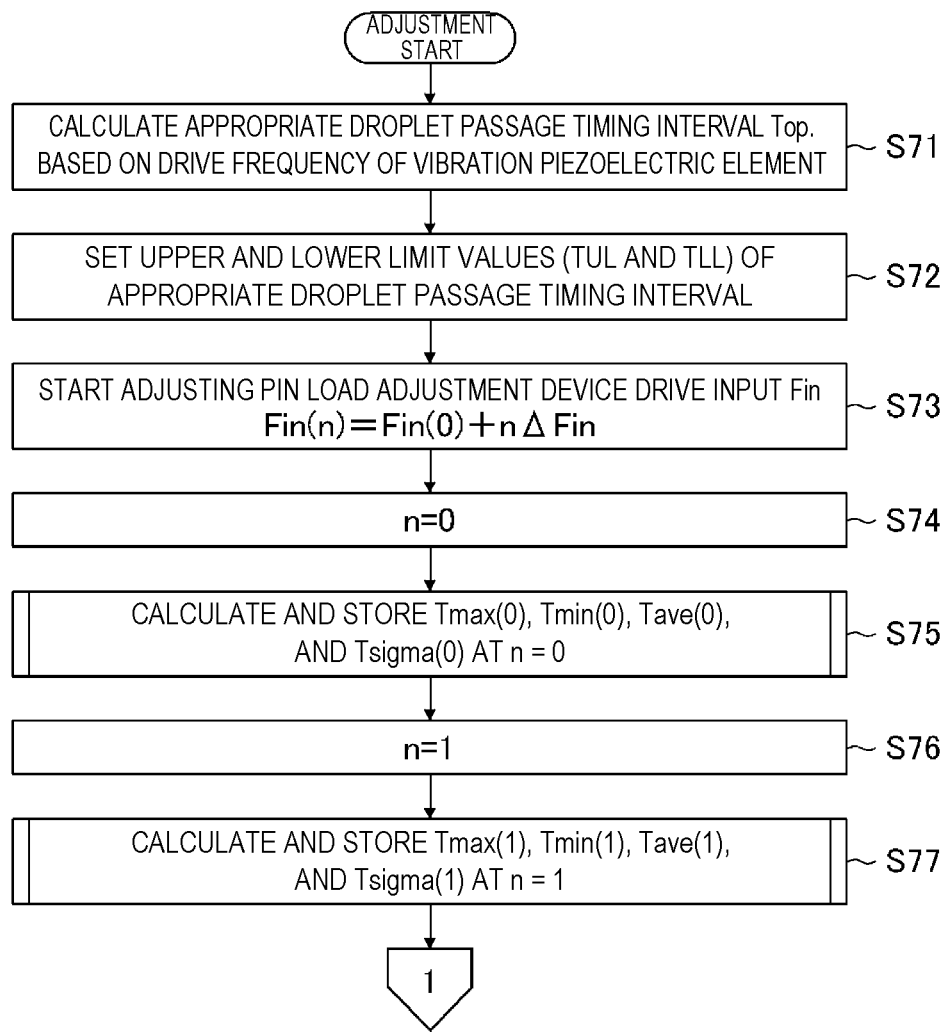
FIG. 18 is a flowchart illustrating exemplary processing contents of adjustment processing of a pin load adjustment device at step S63 in FIG. 17.
Figure 19:
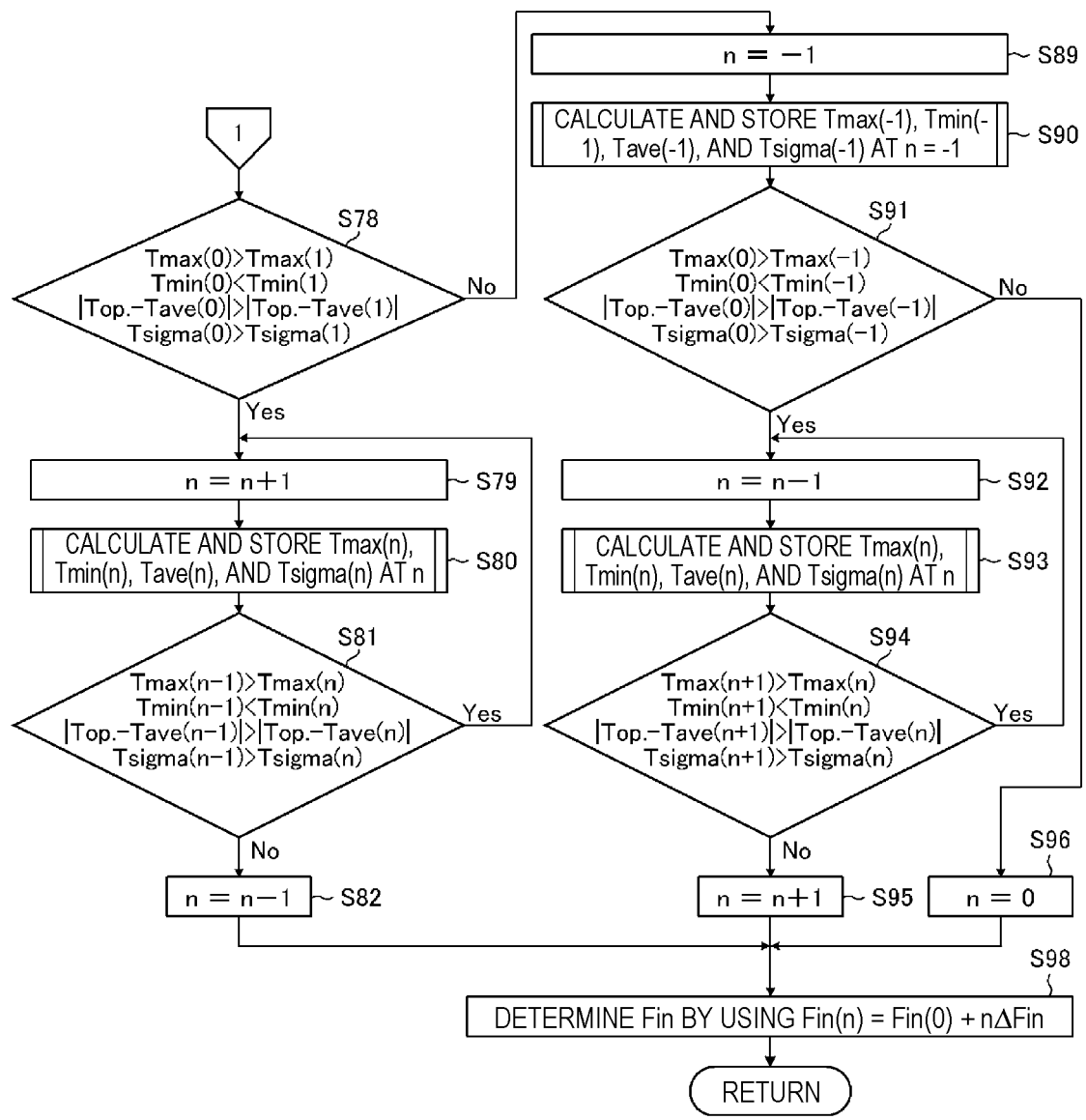
FIG. 19 is a flowchart illustrating exemplary processing contents of adjustment processing of the pin load adjustment device at step S63 in FIG. 17.

FIGS. 18 and 19 are flowcharts illustrating exemplary processing contents of adjustment processing of the pin load adjustment device 320 at step S63 in FIG. 17.

At step S71, the control unit 70 calculates an appropriate droplet passage timing interval Top. based on the drive frequency of the vibration piezoelectric element.

At step S72, the control unit 70 sets the upper and lower limit values of the appropriate droplet passage timing interval. For example, the control unit 70 sets an upper limit value TUL to be the appropriate droplet passage timing interval "+15%", and a lower limit value TLL to be the appropriate droplet passage timing interval "−15%".

At step S73, the control unit 70 starts adjusting a pin load adjustment device drive input Fin. The pin load adjustment device drive input Fin is determined in accordance with an expression below by using a variable parameter "n".

$$Fin(n)=Fin(0)+n\Delta Fin$$

where

Fin(0): the drive input to the pin load adjustment device before adjustment of the device $\Delta Fin$: the unit change amount of Fin The value of $\Delta Fin$ is desirably selected to be an appropriate value with taken into account balance between the accuracy of the adjustment and a time taken for the adjustment.

At step S74, the control unit 70 sets the variable parameter n to be "0".

At step S75, with the setting of n to be "0", the control unit 70 measures the droplet passage timing interval T, calculates Tmax(0), Tmin(0), Tave(0), and Tsigma(0) in association with n being "0", and stores these pieces of data. The contents of the processing at step S75 will be described later with reference to the flowchart of FIG. 20.

At step S76, the control unit 70 changes the value of the variable parameter n to be "1".

Then at step S77, with the setting of n to be "1", the control unit 70 measures the droplet passage timing interval T, calculates Tmax(1), Tmin(1), Tave(1), and Tsigma(1) in association with n being "1", and stores these pieces of data. The flowchart of FIG. 20 to be described later is applied as the contents of the processing at step S77.

Subsequently, the control unit 70 proceeds to step S78 in FIG. 19. At step S78, the control unit 70 determines whether the droplet passage timing interval of n being "1" is more desirable than the droplet passage timing interval of n being "0". Specifically, the control unit 70 determines whether the following four inequalities are satisfied:

$Tmax(0) > Tmax(1)$ $Tmin(0) < Tmin(1)$ $|Top.-Tave(0)| > |Top.-Tave(1)|$ $Tsigma(0) > Tsigma(1)$.

When the result of the determination at step S78 is positive, the control unit 70 proceeds to step S79. At step S79, the control unit 70 increases (increments) the value of the variable parameter n by "1" and sets n+1 to be a new value n.

Subsequently at step S80, with the setting of n, the control unit 70 measures the droplet passage timing interval T, calculates Tmax(n), Tmin(n), Tave(n), and Tsigma(n) in association with n, and stores these pieces of data. The flowchart of FIG. 20 to be described later is applied as the contents of the processing at step S77.

Subsequently at step S81, the control unit 70 determines whether the droplet passage timing interval at n is more desirable than the droplet passage timing interval at n−1. Specifically, the control unit 70 determines whether the following four inequalities are satisfied:

$Tmax(n-1) > Tmax(n)$ $Tmin(n-1) < Tmin(n)$ $|Top.-Tave(n-1)| > |Top.-Tave(n)|$ $Tsigma(n-1) > Tsigma(n)$.

When the result of the determination at step S81 is positive, the control unit 70 returns to step S79 to repeat the processing at steps S79 to S81.

When the result of the determination at step S81 is negative, the control unit 70 proceeds to step S82.

At step S82, the control unit 70 decreases (decrements) the value of the variable parameter n by "1" and sets n−1 to be a new value n. After step S82, the control unit 70 proceeds to step S98.

When the result of the determination at step S78 is negative, the control unit 70 proceeds to step S89. At step S89, the control unit 70 sets the value of the variable parameter n to be "−1".

Then at step S90, with the setting of n to be "−1", the control unit 70 measures the droplet passage timing interval T, calculates Tmax(−1), Tmin(−1), Tave(−1), and Tsigma(−1) in association with n being "−1", and stores these pieces of data. The flowchart of FIG. 20 to be described later is applied as the contents of the processing at step S90.

After step S90 in FIG. 19, the control unit 70 proceeds to step S91. At step S91, the control unit 70 determines whether the droplet passage timing interval of n being "−1" is more desirable than the droplet passage timing interval of n being "0". Specifically, the control unit 70 determines whether the following four inequalities are satisfied:

$Tmax(0) > Tmax(-1)$ $Tmin(0) < Tmin(-1)$ $|Top.-Tave(0)| > |Top.-Tave(-1)|$ $Tsigma(0) > Tsigma(-1)$.

When the result of the determination at step S91 is positive, the control unit 70 proceeds to step S92. At step S92, the control unit 70 decreases (decrements) the value of the variable parameter n by "1" and sets n−1 to be a new value n.

Subsequently at step S93, with the setting of n, the control unit 70 measures the droplet passage timing interval T, calculates Tmax(n), Tmin(n), Tave(n), and Tsigma(n) in association with n, and stores these pieces of data. The flowchart of FIG. 20 to be described later is applied as the contents of the processing at step S93.

After step S93 in FIG. 19, the control unit 70 determines whether the droplet passage timing interval at n is more desirable than the droplet passage timing interval at n+1 at step S94. Specifically, the control unit 70 determines whether the following four inequalities are satisfied:

$$Tmax(n+1) > Tmax(n)$$

$$Tmin(n+1) < Tmin(n)$$

$$|Top.-Tave(n+1)| > |Top.-Tave(n)|$$

$$Tsigma(n+1) > Tsigma(n).$$

When the result of the determination at step S94 is positive, the control unit 70 returns to step S92 to repeat the processing at steps S92 to S94.

When the result of the determination at step S94 is negative, the control unit 70 proceeds to step S95.

At step S95, the control unit 70 increases the value of the variable parameter n by "1" and sets n+1 to be a new value n. After step S95, the control unit 70 proceeds to step S98.

When the result of the determination at step S91 is negative, the control unit 70 proceeds to step S96. At step S96, the control unit 70 sets the value of the variable parameter n to be "0". After step S96, the control unit 70 proceeds to step S98.

At step S98, the control unit 70 determines Fin by using Fin(n) (=Fin(0)+nΔFin). Having determined Fin at step S98, the control unit 70 returns to the flowchart of FIG. 17.

Figure 20:
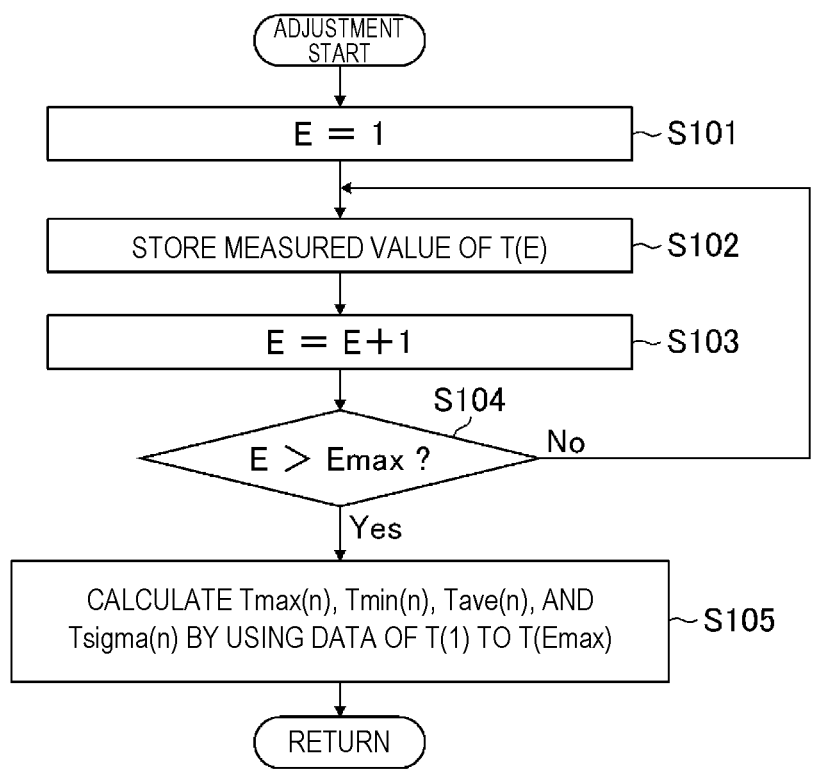
FIG. 20 is a flowchart illustrating exemplary processing contents applied to each of step S77 in FIG. 18 and steps S80, S90, and S93 in FIG. 19.

FIG. 20 is a flowchart illustrating exemplary processing contents applied to each of step S77 in FIG. 18 and steps S80, S90, and S93 in FIG. 19. FIG. 20 is a flowchart illustrating exemplary processing contents of calculating and storing Tmax(n), Tmin(n), Tave(n), and Tsigma(n) at the variable parameter n.

At step S101 in FIG. 20, the control unit 70 sets the value of a variable parameter E indicating the number of times of measurement to be the initial value of E being "1".

At step S102, the control unit 70 measures the passage timing interval between droplets T(E) based on droplet detection signals and stores the measured value.

At step S103, the control unit 70 increases the value E by "1" and sets E+1 to be a new value E.

Subsequently at step S104, the control unit 70 determines whether the value E exceeds predetermined Emax. The value Emax is a predetermined upper limit value of the number of times of measurement. For example, the value Emax may be 3 to 10000 inclusive.

When the result of the determination at step S104 is negative, in other words, when the value E is equal to or smaller than Emax, the control unit 70 returns to step S102 to repeat the processing at steps S102 to S104.

When the result of the determination at step S104 is positive, in other words, when E>Emax is satisfied, the control unit 70 proceeds to step S105.

At step S105, the control unit 70 calculates the maximum passage timing interval Tmax, the minimum passage timing interval Tmin, the passage timing interval average value Tave, and the passage timing interval variance Tsigma by using data of T(1) to T(Emax) obtained through the processing at steps S101 to S104.

The control unit 70 stores the calculated Tmax, Tmin, Tave, and Tsigma as Tmax(n), Tmin(n), Tave(n), and Tsigma (n) in association with the variable parameter n. After the processing at step S105, the control unit 70 returns to the flowcharts in FIGS. 18 and 19.

The droplet detection signals obtained from the droplet detection device 76 and/or the passage timing interval measured from the droplet detection signals in Embodiment 5 is exemplary "detection information from the droplet detection device" in the present disclosure.

11.3 Effect

According to Embodiment 5, even when the pin load varies due to disturbances during EUV generation and droplet coalescence becomes unstable, the defect of droplet coalescence can be detected by the droplet detection device and the pin load can be promptly adjusted.

Thus, it is possible to stabilize droplet coalescence again without performing duty readjustment that involves stop of EUV light emission.

As described above, according to Embodiment 5, it is possible to stabilize droplet coalescence and thus EUV light emission.

12. Embodiment 6

12.1 Configuration

Figure 21:
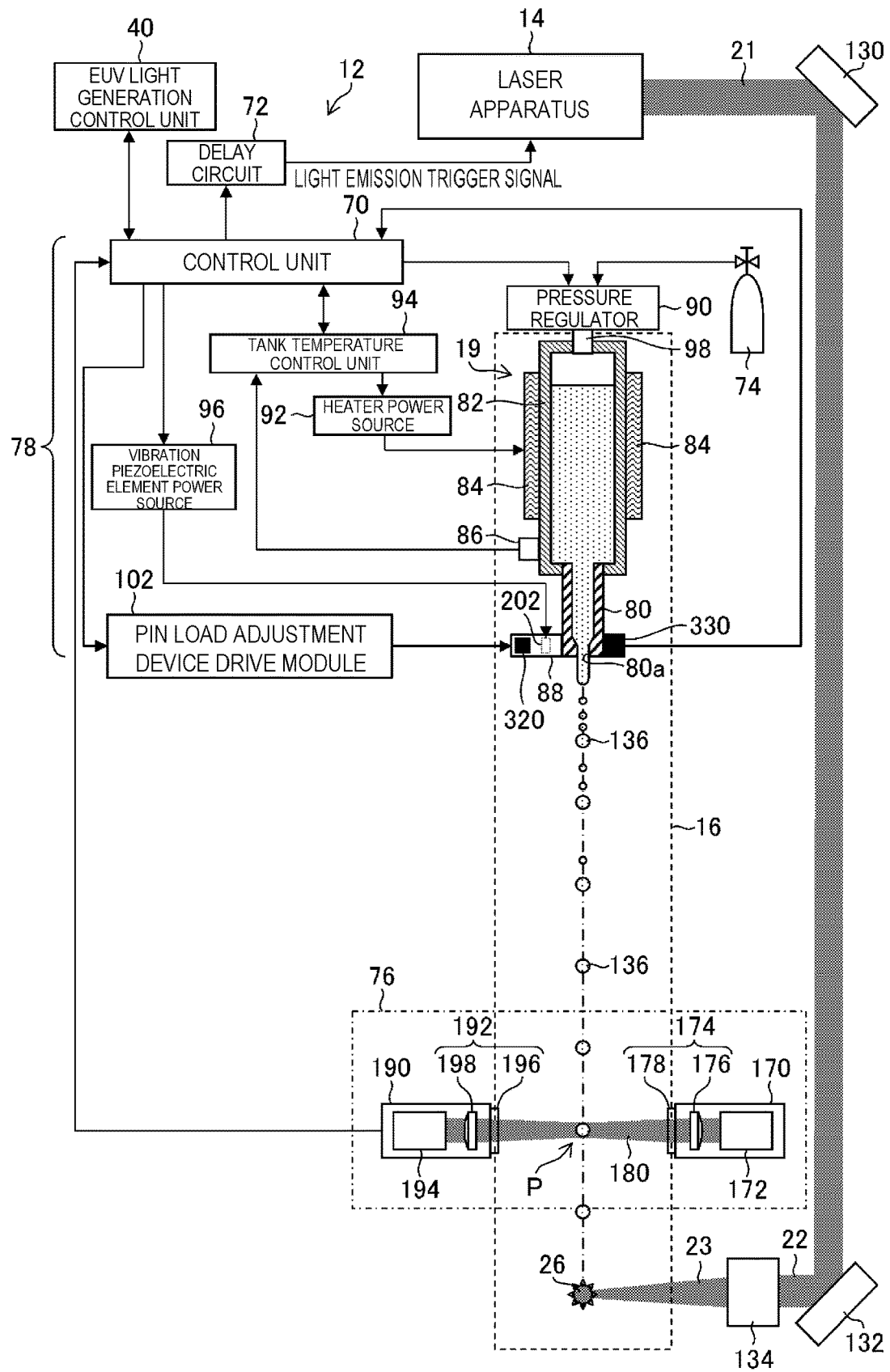
FIG. 21 is a diagram schematically illustrating the configuration of the target supply device according to Embodiment 6.

FIG. 21 schematically illustrates the configuration of the target supply device according to Embodiment 6. Differences from the configuration described with reference to FIG. 3 will be described below.

The target supply device 78 according to Embodiment 6 includes the piezoelectric unit 88 including the pin load adjustment device 320, the pin load adjustment device drive module 322, and the control unit 70 capable of outputting a pin load adjustment device drive input signal to the pin load adjustment device drive module 322, which are described with reference to FIG. 11.

The target supply device 78 illustrated in FIG. 21 also includes a nozzle vibration detection device 330 configured to detect the vibration state of the nozzle 80. The nozzle vibration detection device 330 may be a piezoelectric element or a magnetostrictive element of a contact type or may be a laser Doppler meter or a capacitance distance meter of a non-contact type. When the nozzle vibration detection device 330 is a piezoelectric element, the nozzle vibration detection device 330 may have a structure identical to that of the piezoelectric unit described in Embodiment 1 or 2. The nozzle vibration detection device 330 is an exemplary "nozzle vibration detection device" in the present disclosure.

The position of vibration detection by the nozzle vibration detection device 330 is desirably part of a nozzle component, which is close to the nozzle hole 80a through which a jet of liquid tin is discharged. However, when the nozzle vibration detection device 330 has a shape and a configuration identical to those of the piezoelectric unit described in Embodiment 1 or 2, the nozzle vibration detection device 330 is desirably disposed on a side opposite to the piezoelectric unit 88 with respect to the nozzle 80.

The nozzle vibration detection device 330 is connected with the control unit 70. The control unit 70 may determine the vibration state of the nozzle 80 based on information obtained from the nozzle vibration detection device 330. The control unit 70 may determine a pin load adjustment device control signal based on a result of the determination of the vibration state of the nozzle 80.

12.2 Operation

In the droplet generator assembly work process, a worker adjusts the pin load spring 310 at room temperature such that the pin load becomes equal to a predetermined load, and attaches the piezoelectric unit 88 to the nozzle 80. Thereafter, the droplet generator 19 including the piezoelectric unit 88 is disposed in the chamber 16.

Then, after increase of the tank temperature of the droplet generator 19 is completed, the target supply device according to Embodiment 6 performs defined operation of the vibration piezoelectric element.

The control unit 70 compares a nozzle vibration detection signal obtained from the nozzle vibration detection device 330 during the defined operation of the vibration piezoelectric element with a nozzle vibration signal defined value specified in advance and controls the amount of extension of the pin load adjustment device 320 such that the difference between the signals is within a defined allowable range. The defined allowable range for the difference between the nozzle vibration detection signal and the nozzle vibration signal defined value may be determined to be, for example, equal to or smaller than 1% of the nozzle vibration signal defined value.

The control unit 70 expands the pin load adjustment device 320 until the difference between the nozzle vibration detection signal and the nozzle vibration signal defined value becomes, for example, equal to or smaller than 1% of the nozzle vibration signal defined value. Accordingly, the pin load adjustment device 320 generates force that corrects decrease of the pin load due to the extension of the pin load bolt 308.

Thereafter, the control unit 70 performs the duty adjustment of the vibration piezoelectric element and determines an optimum duty value.

Figure 22:
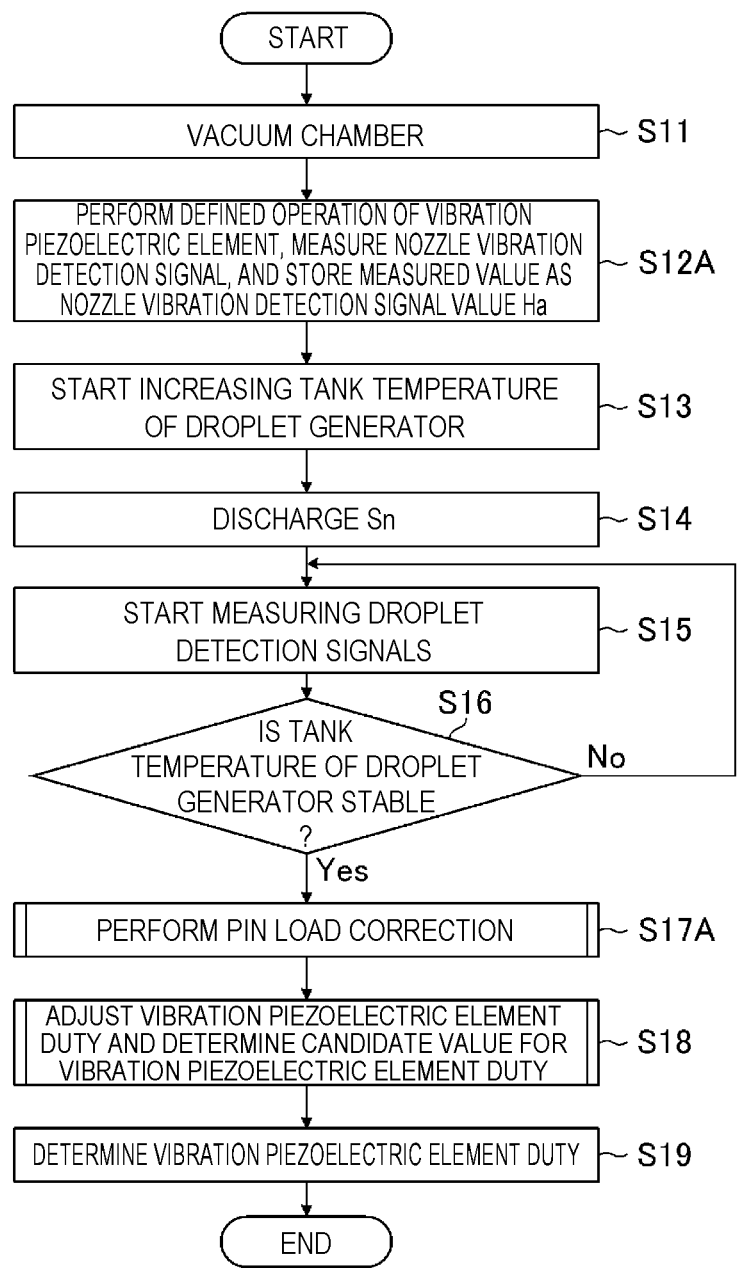
FIG. 22 is a flowchart illustrating exemplary processing contents from chamber vacuuming to vibration piezoelectric element duty determination in Embodiment 6.

12.3 Exemplary Vibration Piezoelectric Element Duty Adjustment Including Pin Load Correction FIG. 22 is a flowchart illustrating exemplary processing contents from chamber vacuuming to vibration piezoelectric element duty determination in Embodiment 6. Differences from the flowchart described with reference to FIG. 15 will be described below. The flowchart illustrated in FIG. 22 includes the process at step S12A in place of step S12 in FIG. 15. The flowchart illustrated in FIG. 22 also includes the process at step S17A in place of step S17 in FIG. 15.

At step S12A in FIG. 22, the control unit 70 performs defined operation of the vibration piezoelectric element, measures the nozzle vibration detection signal, and stores the measured value as a nozzle vibration detection signal value Ha. The defined operation may be, for example, an operation of vibrating the vibration piezoelectric element by applying drive voltage of 100 kHz in the waveform of sine wave with maximum voltage of +50 V and minimum voltage of −50 V to the vibration piezoelectric element. The nozzle vibration detection signal value Ha may be the amplitude voltage of the nozzle vibration detection signal. For example, the nozzle vibration detection signal value Ha may be the total amplitude (peak to peak) of the nozzle vibration detection signal. Hereinafter, similarly to Ha, the term "nozzle vibration detection signal value" may be the total amplitude of the nozzle vibration detection signal output from the nozzle vibration detection device 330.

At step S17A, the control unit 70 performs processing for correcting decrease of the pin load along with increase of the tank temperature of the droplet generator 19.

Figure 23:
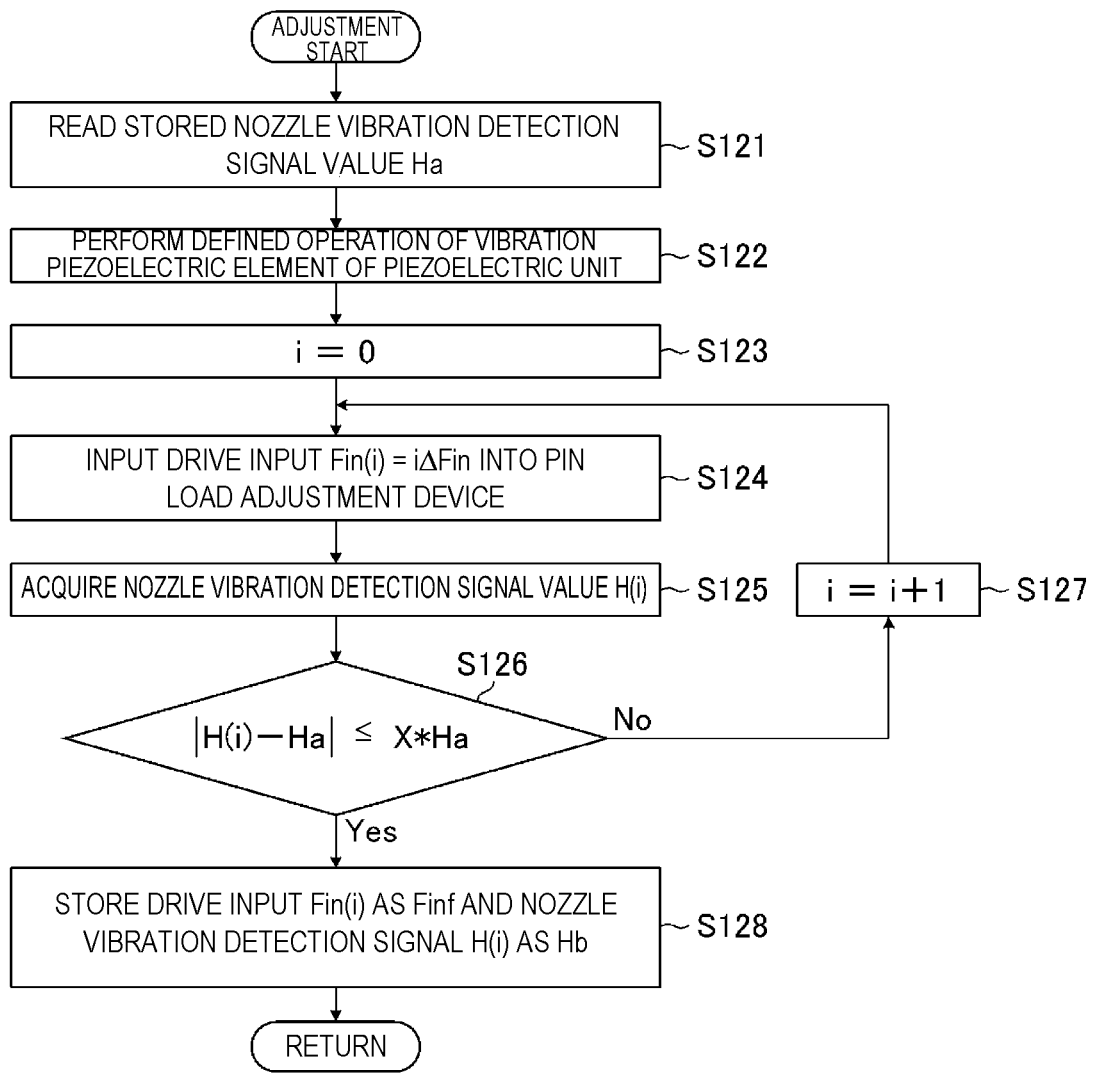
FIG. 23 is a flowchart illustrating exemplary processing contents of pin load correction at step S17A in FIG. 22.

FIG. 23 is a flowchart illustrating exemplary processing contents of pin load correction at step S17A in FIG. 22. At step S121, the control unit 70 reads the stored nozzle vibration detection signal value Ha.

Subsequently at step S122, the control unit 70 performs defined operation of the vibration piezoelectric element of the piezoelectric unit. The defined operation performed at this step is the same as the defined operation performed at step S12A.

Subsequently at step S123, the control unit 70 sets a variable parameter i to be "0".

Subsequently at step S124, the control unit 70 inputs the drive input Fin(i) (=iΔFin) into the pin load adjustment device 320. The value ΔFin is the unit change amount of Fin.

Subsequently at step S125, the control unit 70 acquires a nozzle vibration detection signal value H(i) from the nozzle vibration detection device 330.

At step S126, the control unit 70 determines whether the absolute value of the difference between H(i) and Ha is within a defined allowable range. Specifically, the control unit 70 determines whether |H(i)−Ha|≤X*Ha is satisfied. The value X in "X*Ha" may be, for example, 0.01.

When the result of the determination at step S126 is negative, the control unit 70 proceeds to step S127. At step S127, the control unit 70 increases the value i by "1", sets i+1 to be a new value i, and then returns to step S124.

Steps S124 to S126 are repeated until |H(i)−Ha|≤X*Ha is satisfied.

When the result of the determination at step S126 is positive, the control unit 70 proceeds to step S128. At step S128, the control unit 70 stores the drive input signal Fin(i) as Finf and the nozzle vibration detection signal H(i) as Hb.

Accordingly, the control unit 70 outputs, to the pin load adjustment device drive module 322, a pin load adjustment device control signal for inputting the drive input Finf into the pin load adjustment device 320. As a result, voltage of the drive input Finf is applied to the pin load adjustment device 320 through the pin load adjustment device drive module 322. After step S128, the control unit 70 returns to the flowchart of FIG. 22.

The nozzle vibration detection signal obtained from the nozzle vibration detection device 330 in Embodiment 6 is an exemplary "detection information from the nozzle vibration detection device" in the present disclosure.

12.4 Effect

According to Embodiment 6, after increase of the temperature of the droplet generator, the pin load can be corrected so that the nozzle vibration detection signal value becomes closer to a defined nozzle vibration detection signal value. Accordingly, it is possible to reduce, at higher accuracy than in Embodiment 3, variation in the pin load among droplet generators, which is caused by decrease of the pin load along with the temperature increase, thereby further reducing difference in droplet coalescence among the droplet generators than in Embodiment 3.

As described above, according to Embodiment 6, it is possible to stabilize droplet coalescence and thus EUV light emission.

13. Embodiment 7

13.1 Configuration

The configuration of Embodiment 7 is the same as that of Embodiment 6.

13.2 Operation

Differences of the operation of Embodiment 7 from that of Embodiment 6 will be described below. Embodiment 6 shows an example in which the pin load correction is performed as a stage prior to the vibration piezoelectric element duty adjustment before EUV light emission. In Embodiment 7, the pin load adjustment device adjustment is performed when droplet coalescence instability attributable to pin load variation due to disturbance is detected by the droplet detection device during EUV light emission performed after the pin load correction and the vibration piezoelectric element duty adjustment described in Embodiment 6.

When droplet coalescence instability attributable to pin load variation due to disturbance is detected by the droplet detection device during EUV light emission, EUV light emission is first stopped, and defined operation of the vibration piezoelectric element is performed to measure a nozzle vibration detection signal value Hc. Thereafter, the pin load adjustment device 320 is decompressed or contracted once to increase or decrease the pin load once.

Then, when the difference between the nozzle vibration detection signal value H(1) or H(−1) after the pin load change and Hb is smaller than the difference between Hc and Hb, the length of the pin load adjustment device 320 is changed in the same direction to change the pin load in the same direction. When the difference between the nozzle vibration detection signal value H(1) or H(−1) after the pin load change and Hb is larger than the difference between Hc and Hb, the length of the pin load adjustment device 320 is changed in the opposite direction to change the pin load in the opposite direction.

While sequentially changing the length of the pin load adjustment device 320, the control unit 70 repeats processing of determining the droplet coalescence state at each length to adjust the length of the pin load adjustment device 320, in other words, the pin load, until the nozzle vibration detection signal value H(j) closest to Hb is achieved.

Figure 24:
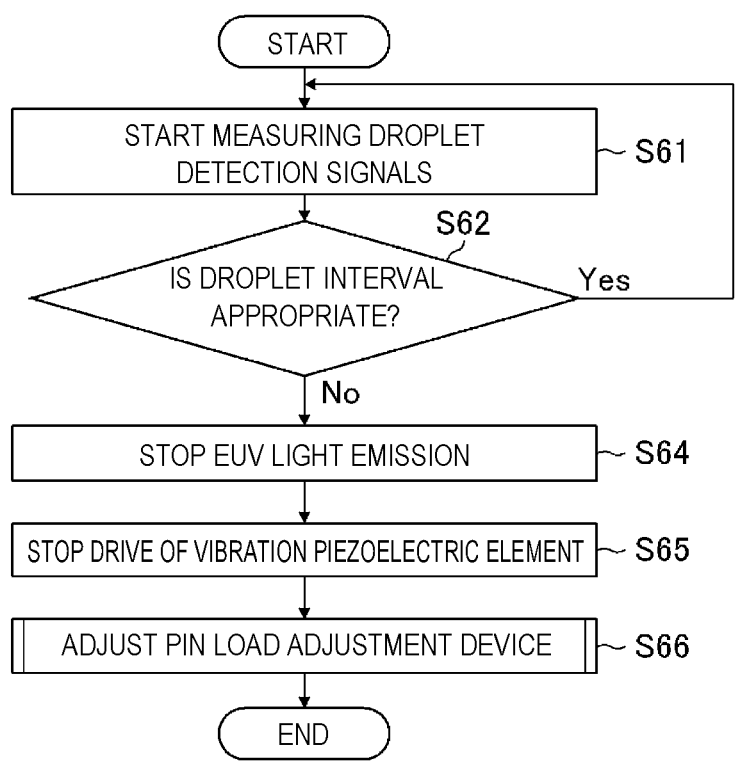
FIG. 24 is a flowchart illustrating exemplary processing contents of pin load adjustment during EUV light emission.

FIG. 24 is a flowchart illustrating exemplary processing contents of the pin load adjustment during EUV light emission. In FIG. 24, a process identical to that of the flowchart illustrated in FIG. 17 is denoted by an identical step number, and duplicate description thereof is omitted. Differences from the flowchart of FIG. 17 will be described below. The flowchart illustrated in FIG. 24 includes steps S64 to S66 in place of step S63 in FIG. 17.

When the result of the determination at step S62 in FIG. 24 is negative, in other words, the droplet interval is inappropriate, the control unit 70 proceeds to step S64 to stop EUV light emission.

Subsequently at step S65, the control unit 70 stops drive of the vibration piezoelectric element. Then at step S66, the control unit 70 performs adjustment processing of the pin load adjustment device 320.

Figure 25:
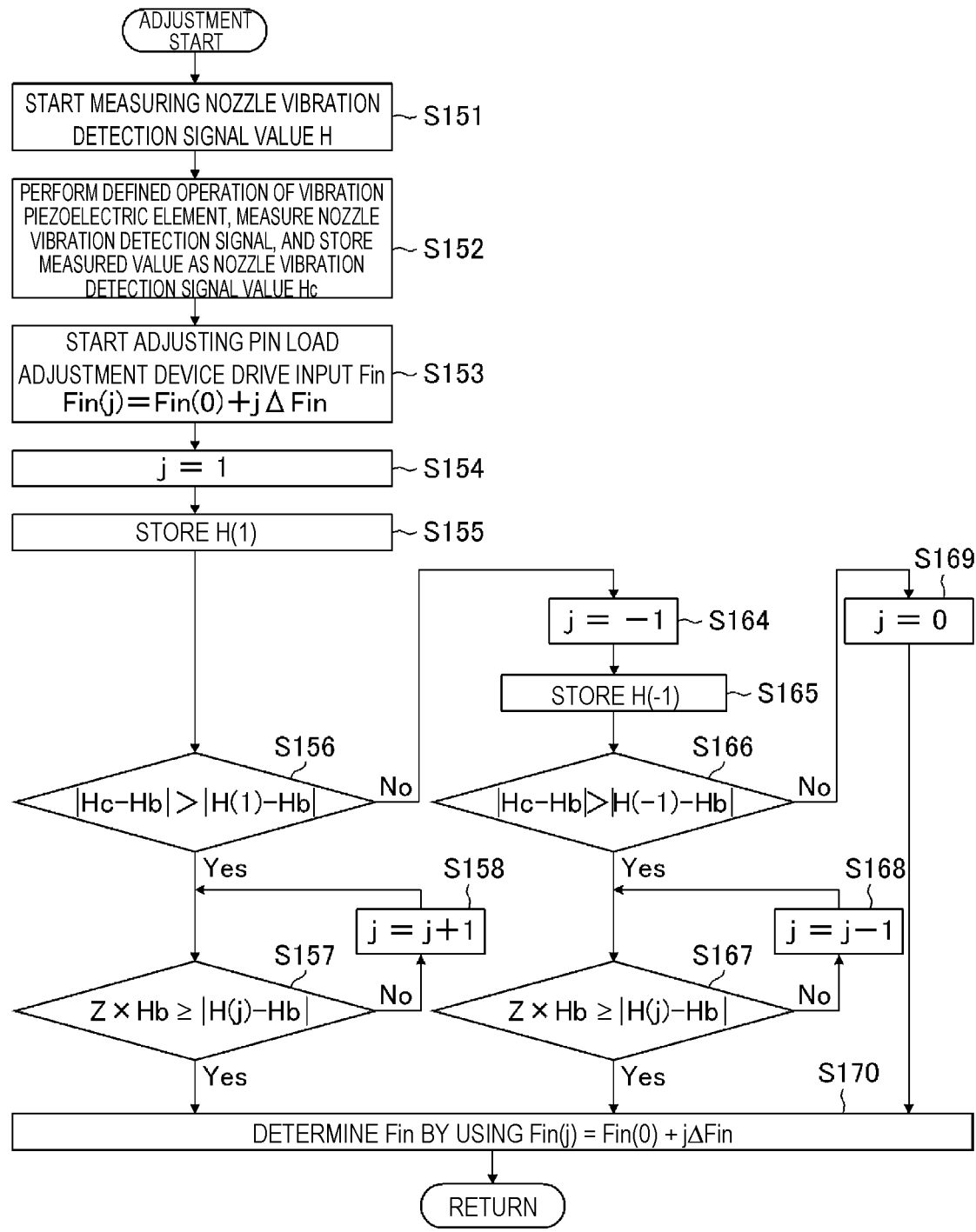
FIG. 25 is a flowchart illustrating exemplary processing contents of adjustment processing of the pin load adjustment device at step S66 in FIG. 24.

FIG. 25 is a flowchart illustrating exemplary processing contents of adjustment processing of the pin load adjustment device 320 at step S66 in FIG. 24.

At step S151, the control unit 70 starts measuring the nozzle vibration detection signal H.

At step S152, the control unit 70 performs defined operation of the vibration piezoelectric element, measures the nozzle vibration detection signal, and stores the measured value as the nozzle vibration detection signal value Hc. The defined operation may be an operation of vibrating the vibration piezoelectric element by applying drive voltage of 100 kHz in the waveform of sine wave with maximum voltage of +50 V and minimum voltage of −50 V to the vibration piezoelectric element. The nozzle vibration detection signal value Ho may be the total amplitude of the nozzle vibration detection signal.

At step S153, the control unit 70 starts adjusting the pin load adjustment device drive input Fin. The pin load adjustment device drive input Fin is determined in accordance with an expression below by using the variable parameter "j".

$$Fin(j)=Fin(0)+j\Delta Fin$$

At step S154, the control unit 70 sets the variable parameter j to be "1".

At step S155, the control unit 70 stores the nozzle vibration detection signal value H(1) measured with the setting of j to be "1".

Subsequently at step S156, the control unit 70 determines whether the nozzle vibration detection signal value H(1) at j being "1" has become closer to Hb. Specifically, the control unit 70 determines whether |Hc−Hb|>|H(1)−Hb| is satisfied.

When the result of the determination at step S156 is positive, the control unit 70 proceeds to step S157. At step S157, the control unit 70 determines whether the absolute value of the difference between H(j) and Hb is within a defined allowable range. Specifically, the control unit 70 determines whether $Z*Hb \geq |H(j)-Hb|$ is satisfied. The value Z in "Z*Hb" indicating the defined allowable range may be, for example, 0.005.

When the result of the determination at step S157 is negative, the control unit 70 proceeds to step S158. At step S158, the control unit 70 increases the value j by "1", sets j+1 to be a new value j, and then returns to step S157. The pin load adjustment device drive input Fin(j) is changed when the value j is updated, and the nozzle vibration detection signal value H(j) is changed when the amount of extension of the pin load adjustment device 320 is changed.

Steps S157 to S158 are repeated until $Z*Hb \geq |H(j)-Hb|$ is satisfied.

When the result of the determination at step S157 is positive, the control unit 70 proceeds to step S170.

When the result of the determination at step S156 is negative, the control unit 70 proceeds to step S164. At step S164, the control unit 70 sets the value j to be "−1".

At step S165, the control unit 70 stores the nozzle vibration detection signal value H(−1) measured with the setting of j to be "−1".

Subsequently at step S166, the control unit 70 determines whether the nozzle vibration detection signal value H(−1) at j being "−1" has become closer to Hb. Specifically, the control unit 70 determines whether |Hc−Hb|>|H(−1)−Hb| is satisfied.

When the result of the determination at step S166 is positive, the control unit 70 proceeds to step S167. At step S167, the control unit 70 determines whether the absolute value of the difference between H(j) and Hb is within a defined allowable range. Specifically, the control unit 70 determines whether $Z*Hb \geq |H(j)-Hb|$ is satisfied.

When the result of the determination at step S167 is negative, the control unit 70 proceeds to step S168. At step S168, the control unit 70 decreases the value j by "1", sets j−1 to be a new value j, and then returns to step S167.

Steps S167 to S168 are repeated until $Z*Hb \geq |H(j)-Hb|$ is satisfied.

When the result of the determination at step S167 is positive, the control unit 70 proceeds to step S170.

When the result of the determination at step S166 is negative, the control unit 70 proceeds to step S169. At step S169, the control unit 70 sets the value j to be "0" and then proceeds to step S170.

At step S170, the control unit 70 determines Fin by using Fin(j) (=Fin(0)+jΔFin). Having determined Fin at step S98, the control unit 70 returns to the flowchart of FIG. 24.

13.3 Effect

According to Embodiment 7, even when the pin load varies due to disturbances during EUV generation and droplet coalescence becomes unstable, when the defect of droplet coalescence is detected by the droplet detection device, EUV light emission is immediately stopped and the pin load is adjusted such that the nozzle vibration detection signal value becomes closer to a defined value. Accordingly, it is possible to stabilize droplet coalescence at higher accuracy than in Embodiment 3, thereby stabilizing EUV light after EUV light emission is started again.

As described above, according to Embodiment 7, it is possible to stabilize droplet coalescence and thus EUV light emission.

14. Embodiment 8

14.1 Configuration

The configuration of the target supply device according to Embodiment 8 is the same as in Embodiment 6.

14.2 Operation

Figure 26:
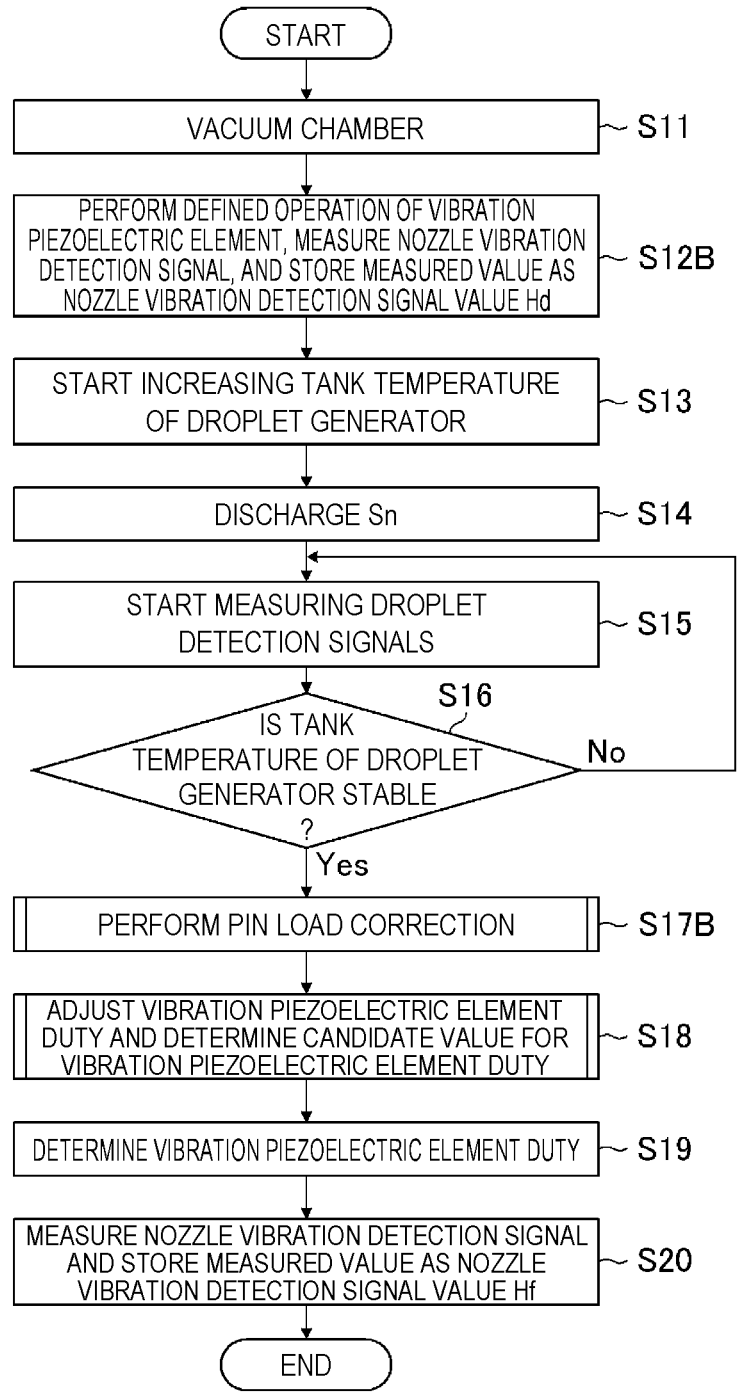
FIG. 26 is a flowchart illustrating exemplary processing contents including processing from chamber vacuuming to vibration piezoelectric element duty determination in Embodiment 8.

Differences from Embodiment 6 will be described below. FIG. 26 is a flowchart illustrating exemplary processing contents including processing from chamber vacuuming to vibration piezoelectric element duty determination in Embodiment 8. In FIG. 26, a process identical to that in the flowchart described with reference to FIG. 15 is denoted by an identical step number, and duplicate description thereof is omitted.

The flowchart illustrated in FIG. 26 includes steps S12B and S17B in place of steps S12 and S17 in FIG. 15. The flowchart of FIG. 26 also includes step S20 after step S19.

At step S12B, the control unit 70 performs defined operation of the vibration piezoelectric element, measures the nozzle vibration detection signal, and stores the measured value as a nozzle vibration detection signal value Hd. The defined operation may be, for example, an operation of vibrating the vibration piezoelectric element by applying drive voltage of 100 kHz in the waveform of sine wave with maximum voltage of +50 V and minimum voltage of −50 V to the vibration piezoelectric element. The nozzle vibration detection signal value Hd may be, for example, the total amplitude of the nozzle vibration detection signal.

At step S17B, the control unit 70 performs processing for correcting decrease of the pin load along with increase of the tank temperature of the droplet generator 19.

Figure 27:
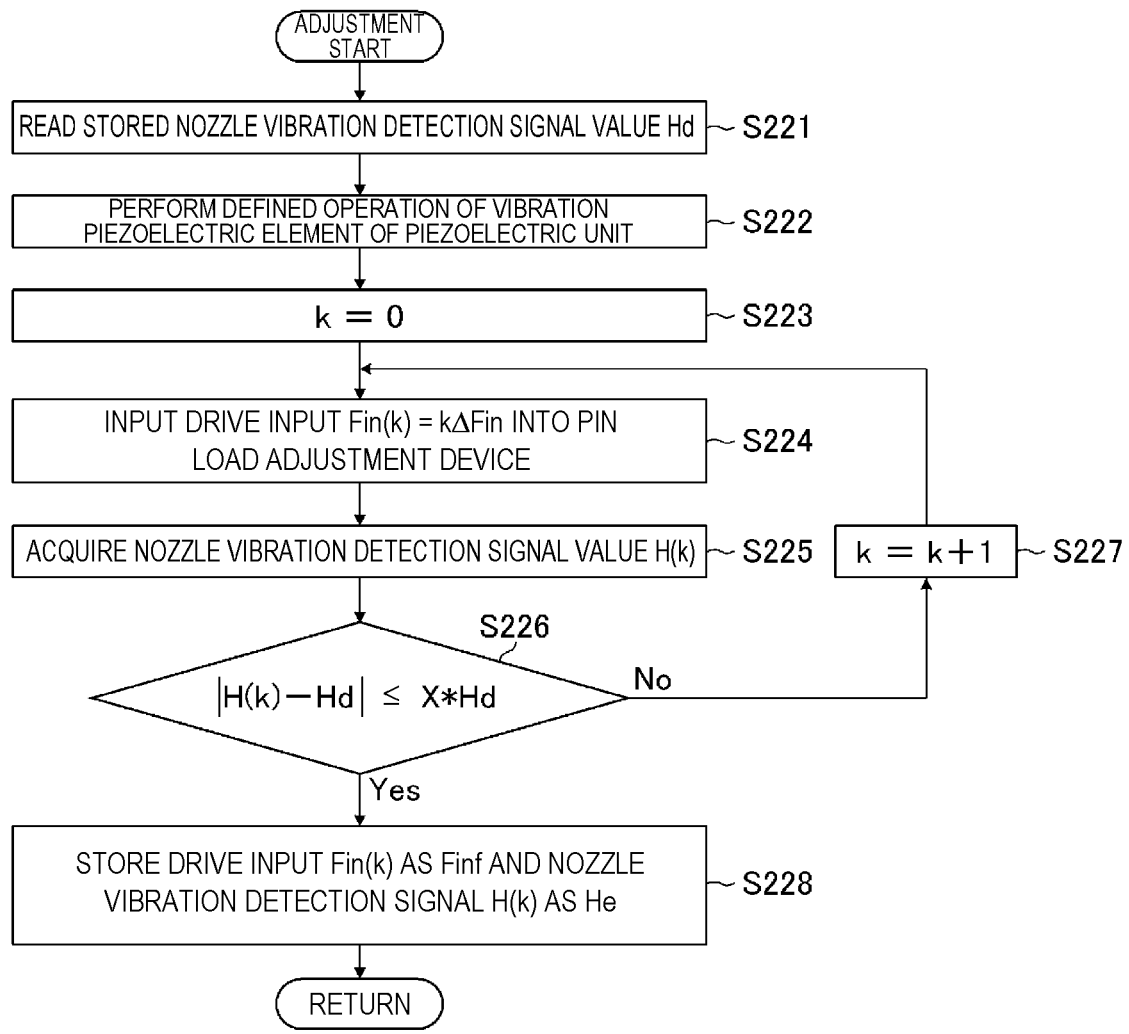
FIG. 27 is a flowchart illustrating exemplary processing contents of pin load correction at step S17B in FIG. 26.

FIG. 27 is a flowchart illustrating exemplary processing contents of pin load correction at step S17B in FIG. 26. At step S221, the control unit 70 reads the stored nozzle vibration detection signal value Hd.

Subsequently at step S222, the control unit 70 performs defined operation of the vibration piezoelectric element of the piezoelectric unit. The defined operation performed at this step is the same as the defined operation performed at step S12B in FIG. 26.

Subsequently at step S223, the control unit 70 sets a variable parameter k to be "0".

Subsequently at step S224, the control unit 70 inputs drive input Fin(k) (=kΔFin) to the pin load adjustment device 320.

Subsequently at step S225, the control unit 70 acquires a nozzle vibration detection signal value H(k) based on the nozzle vibration detection signal from the nozzle vibration detection device 330. The nozzle vibration detection signal value H(k) may be the amplitude voltage of the nozzle vibration detection signal. For example, the nozzle vibration detection signal value H(k) may be the total amplitude (peak to peak) of the nozzle vibration detection signal.

At step S226, the control unit 70 determines whether the absolute value of the difference between H(k) and Hd is within a defined allowable range. Specifically, the control unit 70 determines whether |H(k)−Hd|≤X*Hd is satisfied. The value X in "X*Hd" may be, for example, 0.01.

When the result of the determination at step S226 is negative, the control unit 70 proceeds to step S227. At step S227, the control unit 70 increases the value k by "1", sets k+1 to be a new value k, and then returns to step S224.

Steps S224 to S226 are repeated until |H(k)−Hd|≤X*Hd is satisfied.

When the result of the determination at step S226 is positive, the control unit 70 proceeds to step S228. At step S228, the control unit 70 stores the drive input signal Fin(k) as Finf, and the nozzle vibration detection signal value H(k) as He.

Accordingly, the control unit 70 outputs, to the pin load adjustment device drive module 322, a pin load adjustment device control signal for inputting the drive input Finf into the pin load adjustment device 320. As a result, voltage of the drive input Finf is applied to the pin load adjustment device 320 through the pin load adjustment device drive module 322. After step S228, the control unit 70 returns to the flowchart of FIG. 26.

After the determination of an optimum duty value of the vibration piezoelectric element at step S19 in FIG. 26, the control unit 70 proceeds to step S20.

At step S20, the control unit 70 applies rectangular-wave drive voltage of the duty value determined at step S19 to the vibration piezoelectric element, measures the nozzle vibration detection signal, and stores the measured value as a nozzle vibration detection signal value Hf. The nozzle vibration detection signal value Hf may be the total amplitude of the nozzle vibration detection signal.

14.3 Effect

According to Embodiment 8, similarly to Embodiment 6, after increase of the temperature of the droplet generator, the pin load can be corrected such that the nozzle vibration detection signal has a value closer to a defined value. Accordingly, it is possible to reduce, at higher accuracy than in Embodiment 3, variation in the pin load among droplet generators, which is caused by decrease of the pin load along with the temperature increase, thereby further reducing difference in droplet coalescence among the droplet generators than in Embodiment 3.

15. Embodiment 9

15.1 Configuration

The configuration of Embodiment 9 is the same as that of Embodiment 8.

15.2 Operation

Differences of operation of Embodiment 9 from that in Embodiments 7 and 8 will be described below. In Embodiment 9, when droplet coalescence instability attributable to pin load variation due to disturbance is detected by the droplet detection device during EUV light emission, the adjustment of the pin load is performed without stopping EUV light emission (while continuing EUV light emission).

In Embodiment 9, the signal value Hf stored through execution of the flowchart of FIG. 26 described in Embodiment 8 is used.

Figure 28:
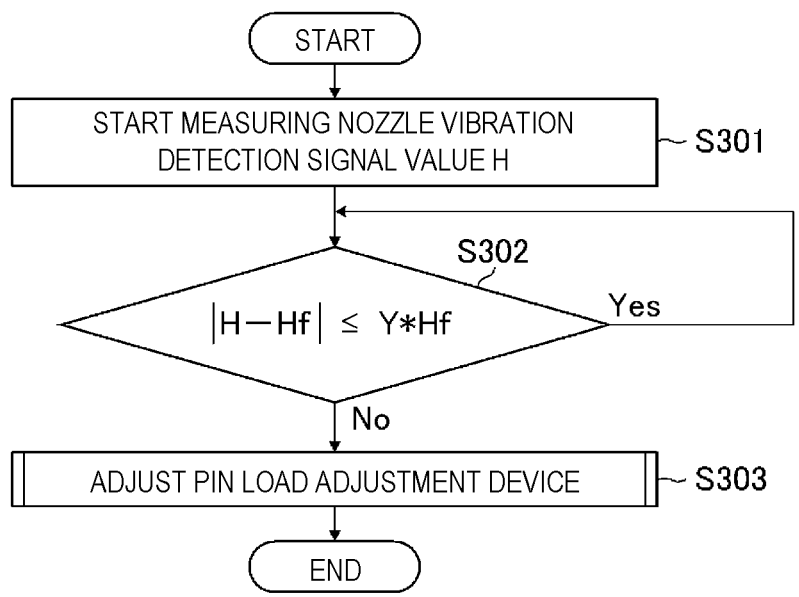
FIG. 28 is a flowchart illustrating exemplary processing contents of pin load adjustment during EUV light emission in Embodiment 9.

FIG. 28 is a flowchart illustrating exemplary processing contents of pin load adjustment during EUV light emission in Embodiment 9.

At step S301, the control unit 70 starts measuring a nozzle vibration detection signal value H. Rectangular-wave drive voltage of the duty value determined at step S19 in FIG. 26 is applied to the vibration piezoelectric element during EUV light emission. The control unit 70 performs the measurement of the nozzle vibration detection signal value H during EUV light emission. The nozzle vibration detection signal value H may be the total amplitude of the nozzle vibration detection signal.

At step S302, the control unit 70 determines whether the absolute value of the difference between the nozzle vibration detection signal value H and the signal value Hf stored in advance is within a defined allowable range. Specifically, the control unit 70 determines whether $|H-Hf| \leq Y*Hf$ is satisfied. The value Y in "Y*Hf" indicating the defined allowable range may be, for example, 0.01.

When the result of the determination at step S302 is positive, the control unit 70 repeats step S302. In other words, the control unit 70 monitors the vibration state of the nozzle 80 based on the nozzle vibration detection signal during EUV light emission.

When the result of the determination at step S302 is negative, in other words, when the absolute value of the difference between the nozzle vibration detection signal value H and Hf exceeds Y*Hf, the control unit 70 proceeds to step S303 to perform the adjustment of the pin load adjustment device 320.

Figure 29:
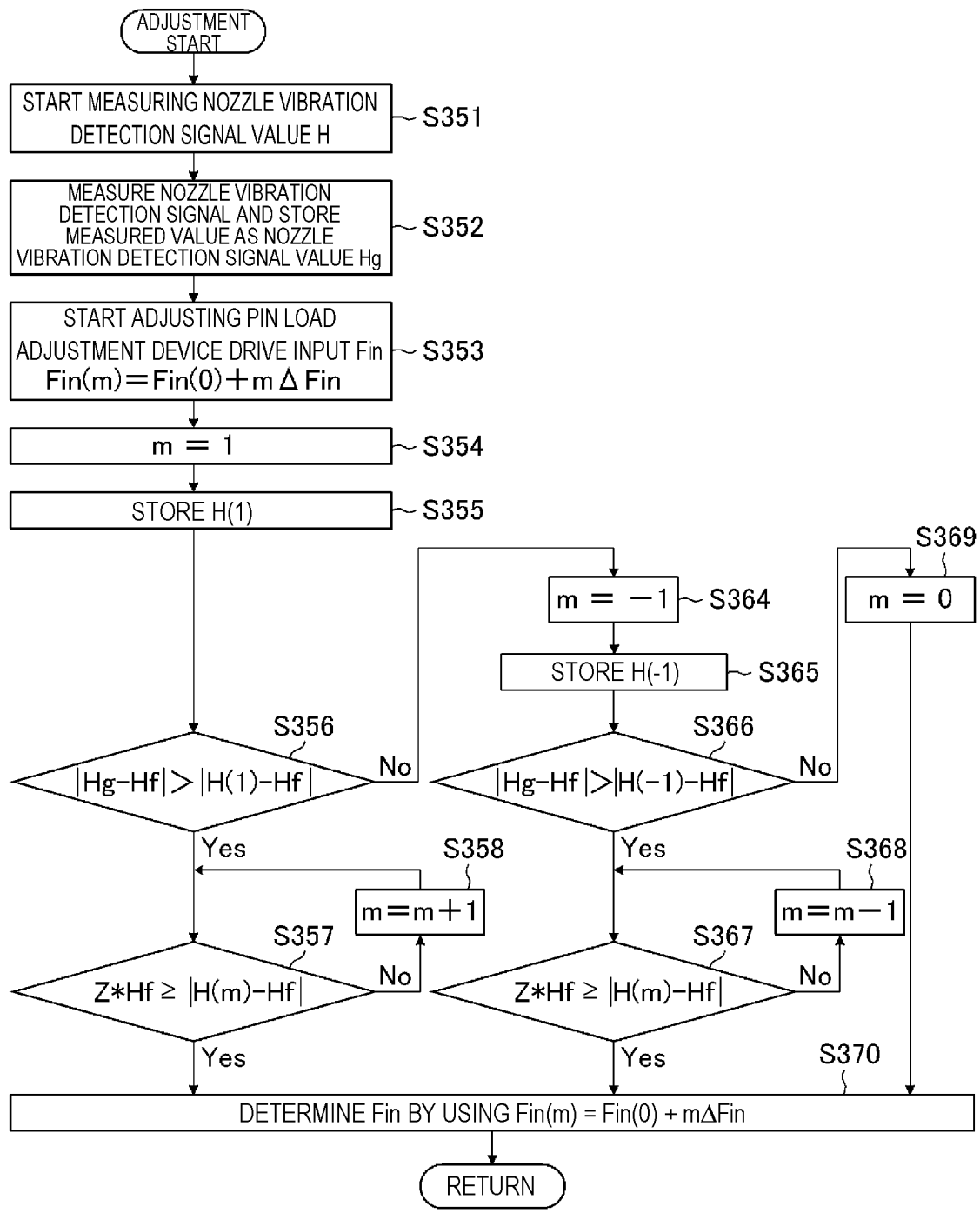
FIG. 29 is a flowchart illustrating exemplary processing contents of adjustment processing of the pin load adjustment device at step S303 in FIG. 28.

FIG. 29 is a flowchart illustrating exemplary processing contents of adjustment processing of the pin load adjustment device 320 at step S303 in FIG. 28.

At step S351 in FIG. 29, the control unit 70 starts measuring the nozzle vibration detection signal H.

At step S352, the control unit 70 measures the nozzle vibration detection signal and stores the measured value as a nozzle vibration detection signal value Hg. The nozzle vibration detection signal value Hg may be the amplitude voltage of the nozzle vibration detection signal. For example, the nozzle vibration detection signal value Hg may be the total amplitude (peak to peak) of the nozzle vibration detection signal.

At step S353, the control unit 70 starts adjusting the pin load adjustment device drive input Fin. The pin load adjustment device drive input Fin is determined in accordance with an expression below by using a variable parameter "m".

$$Fin(m)=Fin(0)+m\Delta Fin.$$

At step S354, the control unit 70 sets the variable parameter m to be "1".

At step S355, the control unit 70 stores the nozzle vibration detection signal value H(m) measured with the setting of m to be "1".

Subsequently at step S356, the control unit 70 determines whether the nozzle vibration detection signal value H(1) at m being "1" has become closer to Hf. Specifically, the control unit 70 determines whether $|Hg-Hf|>|H(1)-Hf|$ is satisfied.

When the result of the determination at step S356 is positive, the control unit 70 proceeds to step S357. At step S357, the control unit 70 determines whether the absolute value of the difference between H(m) and Hf is within a defined allowable range. Specifically, the control unit 70 determines whether $Z*Hf \geq |H(m)-Hf|$ is satisfied. The value Z in "Z*Hf" indicating the defined allowable range may be, for example, 0.005.

When the result of the determination at step S357 is negative, the control unit 70 proceeds to step S358. At step S358, the control unit 70 increases the value m by "1", sets m+1 to be a new value m, and then returns to step S357. The pin load adjustment device drive input Fin(m) is changed when the value m is updated, and the nozzle vibration detection signal value H(m) is changed when the amount of extension of the pin load adjustment device 320 is changed.

Steps S357 to S358 are repeated until $Z*Hf \geq |H(m)-Hf|$ is satisfied.

When the result of the determination at step S357 is positive, the control unit 70 proceeds to step S370.

When the result of the determination at step S356 is negative, the control unit 70 proceeds to step S364. At step S364, the control unit 70 sets the value m to be "−1".

At step S365, the control unit 70 stores the nozzle vibration detection signal value H(−1) measured with the setting of m to be "−1".

Subsequently at step S366, the control unit 70 determines whether the nozzle vibration detection signal value H(−1) at m being "−1" has become closer to Hf. Specifically, the control unit 70 determines whether $|Hg-Hf|>|H(-1)-Hf|$ is satisfied.

When the result of the determination at step S366 is positive, the control unit 70 proceeds to step S367. At step S367, the control unit 70 determines whether the absolute value of the difference between H(m) and Hf is within a defined allowable range. Specifically, the control unit 70 determines whether $Z*Hf \geq |H(m)-Hf|$ is satisfied.

When the result of the determination at step S367 is negative, the control unit 70 proceeds to step S368. At step S368, the control unit 70 decreases the value m by "1", sets m−1 to be a new value m, and then returns to step S367.

Steps S367 to S368 are repeated until $Z*Hf \geq |H(m)-Hf|$ is satisfied.

When the result of the determination at step S367 is positive, the control unit 70 proceeds to step S370.

When the result of the determination at step S366 is negative, the control unit 70 proceeds to step S369. At step S369, the control unit 70 sets the value m to be "0" and then proceeds to step S370.

At step S370, the control unit 70 determines Fin by using Fin(m) (=Fin(0)+mΔFin). Having determined the pin load adjustment device drive input Fin at step S370, the control unit 70 returns to the flowchart of FIG. 28.

15.3 Effect

According to Embodiment 9, even when the pin load varies due to disturbances during EUV generation and droplet coalescence becomes unstable, it is possible to adjust, without stopping drive of the vibration piezoelectric element, the pin load such that the nozzle vibration detection signal in vibration operation at use drive duty returns to the original state. Accordingly, it is possible to stabilize, without stopping EUV light emission, droplet coalescence at higher accuracy than in Embodiment 3, thereby stabilizing EUV light.

As described above, according to Embodiment 9, it is possible to stabilize droplet coalescence and thus EUV light emission.

16. Combination of Embodiments

Embodiments 1 to 9 described above may be combined as appropriate. For example, the processing including pin load correction described in Embodiment 4 and the processing of pin load adjustment during EUV light emission described in Embodiment 5 may be combined.

In addition, for example, the processing including pin load correction described in Embodiment 6 and the processing of pin load adjustment during EUV light emission described in Embodiment 7 may be combined.

17. Exemplary Laser Apparatus

The laser apparatus 14 may include a pre-pulse laser apparatus configured to output a pre-pulse laser beam, and a main pulse laser apparatus configured to output a main pulse laser beam. In the LPP EUV light generation apparatus 12, a target in the form of droplet is diffused through irradiation with a pre-pulse laser beam to form a diffused target, and then the diffused target is irradiated with a main pulse laser beam. When the diffused target is irradiated with the main pulse laser beam in this manner, plasma can be efficiently generated from the target substance. This configuration can improve conversion efficiency (CE) from the energy of the pulse laser beam to the energy of EUV light.

The pre-pulse laser beam for forming a diffused target includes short pulses each having a pulse width shorter than one nanosecond [ns], preferably shorter than 500 picoseconds [ps], more preferably shorter than 50 picoseconds [ps]. In addition, the fluence of each pulse of the pre-pulse laser beam is equal to or smaller than the fluence of each pulse of the main pulse laser beam, and is equal to or larger than 6.5 $J/cm^2$, preferably equal to or larger than 30 $J/cm^2$, more preferably equal to or larger than 45 $J/cm^2$.

With such a configuration, the target can be diffused through breakdown into minute particles by shortening the pulse width of each pulse of the pre-pulse laser beam. Accordingly, when a diffused target is irradiated with the main pulse laser beam, plasma can be efficiently generated from the target, which leads to improvement of the CE.

Alternatively, the target may be irradiated with a plurality of pre-pulse laser beams before irradiation with the main pulse laser beam.

Figure 30:
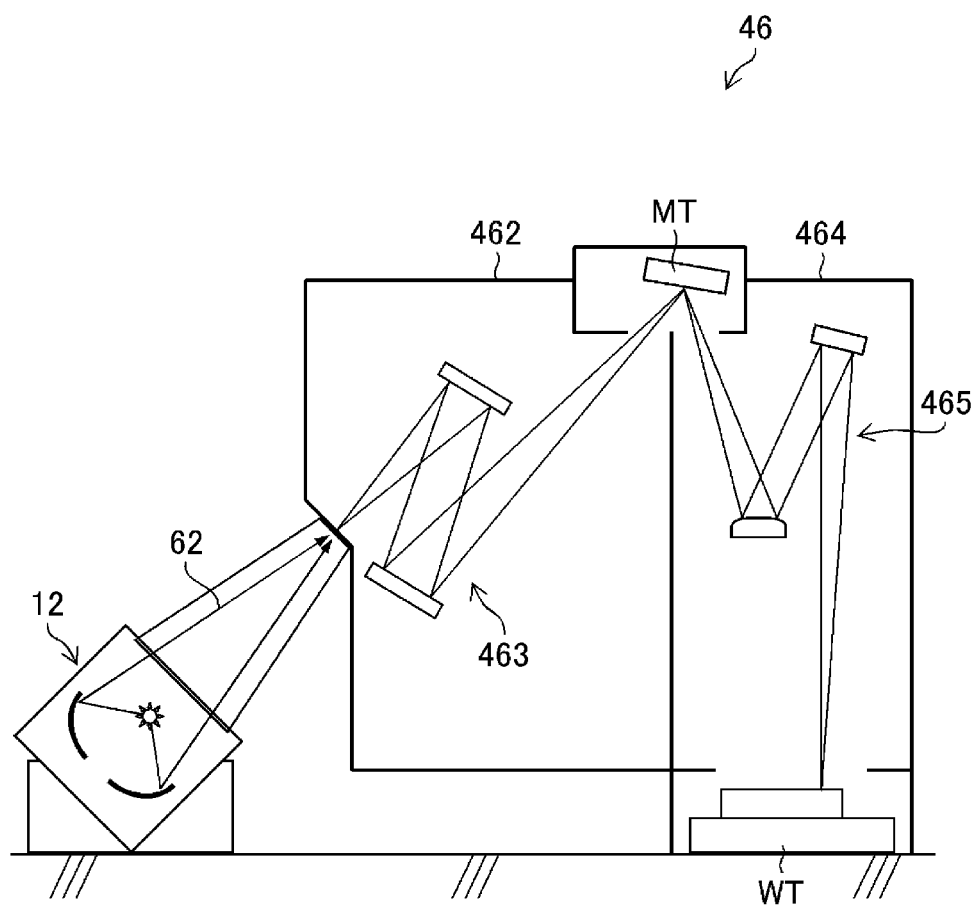
FIG. 30 is a diagram illustrating a schematic configuration of an exposure apparatus connected with the EUV light generation apparatus.

18. Exemplary Electronic Device Manufacturing Method Using EUV Light Generation Apparatus FIG. 30 is a diagram illustrating a schematic configuration of the exposure apparatus connected with the EUV light generation apparatus. In FIG. 30, the exposure apparatus 46 includes a mask irradiation unit 462 and a workpiece irradiation unit 464. In the mask irradiation unit 462, a mask pattern on a mask table MT is irradiated with the EUV light 62 incident from the EUV light generation apparatus 12 through a reflection optical system 463. The EUV light generation apparatus 12 has a configuration in at least one of the forms described in Embodiments 1 to 9.

In the workpiece irradiation unit 464, the EUV light 62 is reflected by the mask table MT to be imaged on a workpiece (not illustrated) disposed on a workpiece table WT through a reflection optical system 465.

The workpiece is a photosensitive substrate such as a semiconductor wafer to which photoresist is applied. The exposure apparatus 46 translates the mask table MT and the workpiece table WT in synchronization to expose the workpiece to the EUV light reflected by the mask pattern.

Through an exposure process as described above, a device pattern can be transferred onto the semiconductor wafer to manufacture a semiconductor device. The semiconductor device is an exemplary electronic device.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. A target supply device comprising:
   a nozzle through which a liquid target substance is output; and
   a vibration unit configured to vibrate the target substance supplied to the nozzle,
   the vibration unit including
   a vibration element configured to vibrate in accordance with applied drive voltage,
   a vibration transfer unit contacting the nozzle and configured to transfer vibration of the vibration element to the nozzle,
   a load application member configured to apply a pressing load for pressing the vibration transfer unit against the nozzle, and
   a load adjustment device configured to adjust the pressing load in accordance with a signal from outside.

2. The target supply device according to claim 1, wherein the load adjustment device includes any one of a piezoelectric element, a magnetostrictive element, an air-pressure element, an oil-pressure element, a water-pressure element, and a screw element.

3. The target supply device according to claim 1, wherein the signal for operating the load adjustment device is direct-current voltage.

4. The target supply device according to claim 1, wherein the vibration unit further includes an elastic member configured to autonomously expand and contract to press the vibration transfer unit against the nozzle.

5. The target supply device according to claim 4, wherein the load adjustment device and the elastic member are disposed in series in a direction in which the vibration transfer unit is pressed against the nozzle.

6. The target supply device according to claim 1, wherein
   the vibration unit includes a plurality of the load adjustment devices, and
   the load adjustment devices are disposed at positions symmetrically centered at the vibration transfer unit.

7. The target supply device according to claim 1, wherein the load application member is a bolt.

8. The target supply device according to claim 1, further comprising a control unit configured to control drive of the load adjustment device.

9. The target supply device according to claim 8, further comprising:
   a tank configured to house the target substance; and
   a heater disposed in the tank and configured to melt the target substance in the tank, wherein
   after a temperature of the tank is increased by the heater, the control unit performs load correction that expands the load adjustment device to compensate decrease of the pressing load due to the increase of the temperature of the tank.

10. The target supply device according to claim 8, further comprising a droplet detection device configured to detect a state of a droplet of the target substance output from the nozzle, wherein
    the control unit changes, based on detection information from the droplet detection device, the signal supplied to the load adjustment device such that the droplet becomes a predetermined state.

11. The target supply device according to claim 10, wherein the control unit
determines a coalescent state of the droplet based on detection information from the droplet detection device, and
changes the signal supplied to the load adjustment device based on a result of determination of the coalescent state of the droplet.

12. The target supply device according to claim 10, wherein the control unit determines necessity of adjustment of the pressing load based on detection information from the droplet detection device in a light emission duration in which the target substance output from the nozzle is irradiated with a laser beam to generate extreme ultraviolet light.

13. The target supply device according to claim 12, wherein, when it is determined that the pressing load needs to be adjusted in the light emission duration of the extreme ultraviolet light, the control unit adjusts an amount of expansion and contraction of the load adjustment device by changing the signal supplied to the load adjustment device.

14. The target supply device according to claim 8, further comprising a nozzle vibration detection device configured to detect a vibration state of the nozzle, wherein
the control unit changes, based on detection information from the nozzle vibration detection device, the signal supplied to the load adjustment device such that the vibration state of the nozzle becomes a predetermined state.

15. The target supply device according to claim 14, wherein the control unit
determines the vibration state of the nozzle based on detection information from the nozzle vibration detection device, and
changes the signal supplied to the load adjustment device based on a result of determination of the vibration state of the nozzle.

16. The target supply device according to claim 14, wherein the control unit determines necessity of adjustment of the pressing load based on detection information from the nozzle vibration detection device in a light emission duration in which the target substance output from the nozzle is irradiated with a laser beam to generate extreme ultraviolet light.

17. The target supply device according to claim 16, wherein, when it is determined that the pressing load needs to be adjusted in the light emission duration of the extreme ultraviolet light, the control unit adjusts an amount of expansion and contraction of the load adjustment device by changing the signal supplied to the load adjustment device while stopping generation of the extreme ultraviolet light.

18. The target supply device according to claim 16, wherein, when it is determined that the pressing load needs to be adjusted in the light emission duration of the extreme ultraviolet light, the control unit adjusts an amount of expansion and contraction of the load adjustment device by changing the signal supplied to the load adjustment device while not stopping generation of the extreme ultraviolet light.

19. An extreme ultraviolet light generation apparatus configured to generate plasma from a target substance by irradiating the target substance with a laser beam to generate extreme ultraviolet light from the plasma, the extreme ultraviolet light generation apparatus comprising:
a chamber into which the laser beam is introduced; and
a target supply device configured to supply the target substance into the chamber,
the target supply device including
a nozzle through which a liquid target substance is output, and
a vibration unit configured to vibrate the target substance supplied to the nozzle, and
the vibration unit including
a vibration element configured to vibrate in accordance with applied drive voltage,
a vibration transfer unit contacting the nozzle and configured to transfer vibration of the vibration element to the nozzle,
a load application member configured to apply a pressing load for pressing the vibration transfer unit against the nozzle, and
a load adjustment device configured to adjust the pressing load in accordance with a signal from outside.

20. An electronic device manufacturing method comprising:
generating plasma from a target substance by irradiating the target substance with a laser beam by using an extreme ultraviolet light generation apparatus to generate extreme ultraviolet light from the plasma, the extreme ultraviolet light generation apparatus including
a chamber into which the laser beam is introduced, and
a target supply device configured to supply the target substance into the chamber,
the target supply device including
a nozzle through which a liquid target substance is output, and
a vibration unit configured to vibrate the target substance supplied to the nozzle,
the vibration unit including
a vibration element configured to vibrate in accordance with applied drive voltage,
a vibration transfer unit contacting the nozzle and configured to transfer vibration of the vibration element to the nozzle,
a load application member configured to apply a pressing load for pressing the vibration transfer unit against the nozzle, and
a load adjustment device configured to adjust the pressing load by operating in accordance with a signal from outside;
outputting the extreme ultraviolet light to an exposure apparatus; and
exposing a photosensitive substrate to the extreme ultraviolet light in the exposure apparatus.

* * * * *